United States Patent
Yang

(10) Patent No.: US 9,239,782 B2
(45) Date of Patent: Jan. 19, 2016

(54) NONVOLATILE MEMORY DEVICE AND PROGRAM METHOD THEREOF

(71) Applicant: SAMSUNG ELECTRONICS CO., LTD., Gyeonggi-do (KR)

(72) Inventor: Woo-Young Yang, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 284 days.

(21) Appl. No.: 13/830,310

(22) Filed: Mar. 14, 2013

(65) Prior Publication Data

US 2013/0311710 A1 Nov. 21, 2013

(30) Foreign Application Priority Data

May 17, 2012 (KR) .................. 10-2012-0052601

(51) Int. Cl.
G06F 12/00 (2006.01)
G06F 12/02 (2006.01)
G11C 11/56 (2006.01)
G11C 16/06 (2006.01)
G11C 16/22 (2006.01)

(52) U.S. Cl.
CPC ........ G06F 12/0246 (2013.01); G11C 11/5628 (2013.01); G11C 16/06 (2013.01); G11C 16/22 (2013.01)

(58) Field of Classification Search
None
See application file for complete search history.

(56) References Cited

U.S. PATENT DOCUMENTS

| | | | |
|---|---|---|---|
| 4,799,149 A | 1/1989 | Wolf | |
| 6,661,698 B1 | 12/2003 | Kang | |
| 7,440,327 B1 | 10/2008 | Sekar et al. | |
| 7,602,642 B2 | 10/2009 | Choi | |
| 7,672,162 B2 | 3/2010 | Hwang | |
| 7,843,732 B2 | 11/2010 | Lee et al. | |
| 7,900,102 B2 * | 3/2011 | Sokolov | G11C 29/34 |
| 7,945,760 B1 | 5/2011 | Barry et al. | |
| 7,990,765 B2 | 8/2011 | Park et al. | |
| 8,027,194 B2 | 9/2011 | Lee et al. | |
| 8,031,522 B2 | 10/2011 | Jang et al. | |
| 8,078,830 B2 | 12/2011 | Kleihorst et al. | |
| 8,489,804 B1 * | 7/2013 | Nguyen | G06F 12/00 |
| 8,493,781 B1 * | 7/2013 | Meir | H01L 27/115 |
| 8,661,301 B1 * | 2/2014 | Yen | G11C 16/22 |
| | | | 711/103 |
| 8,732,431 B2 * | 5/2014 | Culley | G06F 12/00 |
| 8,954,825 B2 * | 2/2015 | Radke | G11C 29/42 |
| 2004/0268063 A1 | 12/2004 | Lasser | |

(Continued)

FOREIGN PATENT DOCUMENTS

| | | |
|---|---|---|
| JP | 2006040013 | 2/2006 |
| JP | 2006120250 | 5/2006 |

(Continued)

*Primary Examiner* — Barboucarr Faal
(74) *Attorney, Agent, or Firm* — F. Chau & Associates, LLC

(57) ABSTRACT

Disclosed is a nonvolatile memory device which includes a nonvolatile memory including a plurality of LSB and MSB pages at a plurality of wordlines; and a controller controlling the nonvolatile memory. The controller controls the nonvolatile memory such that an LSB program operation on a first wordline of the plurality of wordlines is programmed and then an LSB program operation on a second wordline of the plurality of wordlines is programmed. When the LSB program operation on the second wordline is performed, the nonvolatile memory stores information about LSB data programmed at the first wordline at a spare area of the second wordline.

16 Claims, 22 Drawing Sheets

(56) References Cited

U.S. PATENT DOCUMENTS

| | | | |
|---|---|---|---|
| 2006/0271725 A1* | 11/2006 | Wong | G06F 12/00 |
| 2008/0005510 A1* | 1/2008 | Sepe | G06F 12/16 |
| 2008/0266948 A1* | 10/2008 | Jang | G11C 16/10 |
| 2009/0013139 A1 | 1/2009 | Woo et al. | |
| 2009/0021999 A1 | 1/2009 | Tanimura et al. | |
| 2010/0037009 A1* | 2/2010 | Yano | G06F 12/00 |
| 2010/0149869 A1 | 6/2010 | Kim et al. | |
| 2010/0198794 A1 | 8/2010 | Kim et al. | |
| 2010/0274952 A1* | 10/2010 | Lee | G06F 12/00 |
| 2011/0202710 A1 | 8/2011 | Zhao et al. | |
| 2011/0216587 A1* | 9/2011 | Lee | G11C 16/04 |
| 2011/0314218 A1* | 12/2011 | Bert | G06F 12/08 |
| 2012/0320673 A1* | 12/2012 | Kwak | G11C 16/10 |

FOREIGN PATENT DOCUMENTS

| | | |
|---|---|---|
| JP | 2010067263 | 3/2010 |
| JP | 2010259004 | 11/2010 |
| KR | 100600301 | 7/2006 |
| KR | 20090129625 | 12/2009 |
| KR | 20100013963 | 2/2010 |
| KR | 20110120469 | 11/2011 |
| KR | 20120003282 | 1/2012 |

* cited by examiner

NONVOLATILE MEMORY DEVICE AND PROGRAM METHOD THEREOF

CROSS-REFERENCE TO RELATED APPLICATIONS

A claim for priority under 35 U.S.C. §119 is made to Korean Patent Application No. 10-2012-0052601 filed May 17, 2012, in the Korean Intellectual Property Office, the entire contents of which are hereby incorporated by reference.

TECHNICAL FIELD

The inventive concept described herein relates to a nonvolatile memory device, and more particularly to a nonvolatile memory device capable of supporting a multi-level cells and a multi-level programming method thereof.

DISCUSSION OF THE RELATED ART

In general, semiconductor memory devices may include volatile memories such as DRAM, SRAM, and the like and nonvolatile memories such as EEPROM, FRAM, PRAM, MRAM, Flash Memory, and the like. While the volatile memories lose their stored contents at power-off, the nonvolatile memories retain the stored contents even at power-off.

In recent years, devices using nonvolatile memory have increased with the increasing consumer use of portable computing and communications devices and solid state disks (SSD). For example, a nonvolatile memory may be used as storage devices of an MP3 player, a digital camera, a portable telephone, a camcorder, a flash card, a solid state disk (SSD), and the like.

As devices using nonvolatile memories as their storage increase in popularity, the demand for greater storage capacities may increase. One of methods of increasing a nonvolatile memory's storage capacity may be to operate in a multi-level cell (MLC) manner in which a plurality of bits is stored in each memory cell.

However, an MLC program method may cause such an error that lower-bit (LSB) data written at one memory cell is damaged by the writing of upper-bit (MSB) data into the other memory cells. For example, in a case where sudden power-off (SPO) or program fail arises during programming of upper-bit (MSB) data, the value of lower-bit (LSB) data stored at a memory cell may be changed by influence of upper-bit (MSB) data being written at the other nearby memory cells.

SUMMARY

An aspect of the inventive concept provides a nonvolatile memory device that comprises a nonvolatile memory including a plurality of pages; and a controller configured to control the nonvolatile memory, wherein the controller controls the nonvolatile memory such that an LSB program operation on a first page of the plurality of pages is programmed and then an LSB program operation on a second page of the plurality of pages is programmed; and wherein while the LSB program operation on the second page is performed, the nonvolatile memory stores information about LSB data programmed at the first page at a spare area of the second page.

In an exemplary embodiment, when a logical address of data programmed at the first page is equal to a logical address of data programmed at the second page, the nonvolatile memory stores information indicating that LSB data programmed at the first page is invalidated, at a spare area of the second page.

In an exemplary embodiment, after an LSB program operation on the second page is performed, the nonvolatile memory performs an MSB program operation on a third page sharing the same word line as the first page.

In an exemplary embodiment, the nonvolatile memory does not perform a backup operation on data stored at the first page.

In an exemplary embodiment, if sudden power-off occurred during a program operation on the third page, the controller controls the nonvolatile memory to skip a recovery operation on data stored at the first page based on information indicating that data programmed at the first page is invalidated.

In an exemplary embodiment, if a logical address of data programmed at the first page is not equal to a logical address of data programmed at the second page, the nonvolatile memory stores address information, indicating a backup location of data programmed at the first page, at a spare area of the second page.

In an exemplary embodiment, after an LSB program operation on the second page is performed, the controller controls the nonvolatile memory such that an MSB program operation on a third page, sharing the same word line as the first word line, of the plurality of pages is performed. The nonvolatile memory backs up data programmed at the first page to a location indicated by the address information before an MSB program operation on the third page is performed.

In an exemplary embodiment, the controller comprises a mapping table which manages logical and physical addresses associated with a page to be programmed of the plurality of pages; and an LSB recovery manager which judges whether a logical address of write-requested data is equal to a logical address of a programmed page, based on the mapping table.

In an exemplary embodiment, the mapping table further includes information indicating whether data stored at the programmed page is LSB data. When a logical address of the write-requested data is equal to a logical address of a selected one of programmed pages, the LSB recovery manager judges whether the selected page is an LSB page, based on the mapping table.

In an exemplary embodiment, the LSB recovery manager judges whether a page at which the write-requested data is to be stored is an LSB page, based on the mapping table.

In an exemplary embodiment, the controller controls the nonvolatile memory to perform a program operation by a unit formed of a plurality of pages.

An aspect of the inventive concept provides a program method of a nonvolatile memory supporting a multi-level cell manner. The program method comprises receiving write-requested data; judging whether a previous LSB page of the write-requested data is invalidated, based on the write-requested data; and if the previous LSB page is invalidated by the write-requested data, storing information, indicating that the previous LSB page is invalidated, at a spare area of a page at which the write-requested data is to be programmed.

In an exemplary embodiment, if the previous LSB page is invalidated by the write-requested data, an operation for backing up data stored at the previous LSB page is not performed.

In an exemplary embodiment, the program method further comprises storing location information, at which the previous LSB page is to be backed up, at a spare area of the page where the write-requested data is to be programmed, when a logical address of the write-requested data is not equal to a logical address of the previous LSB page.

In an exemplary embodiment, the program method further comprises comparing a logical address of the write-requested data with a logical address managed at a mapping table.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

BRIEF DESCRIPTION OF THE FIGURES

The above and other features will become apparent from the following description with reference to the following figures, wherein like reference numerals refer to like parts throughout the various figures unless otherwise specified, and wherein.

DETAILED DESCRIPTION OF EXEMPLARY EMBODIMENTS

Figure 1:
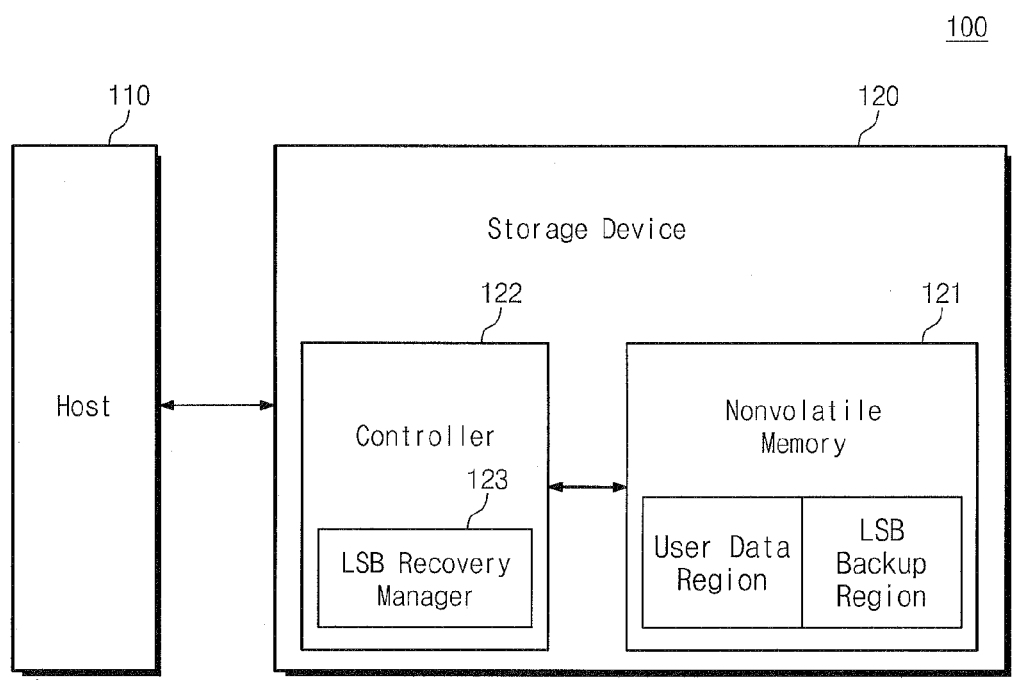
FIG. 1 is a block diagram of a memory system according to an embodiment of the inventive concept.

FIG. 1 is a block diagram of a memory system according to an exemplary embodiment of the inventive concept. In FIG. 1, the memory system 100 supports an LSB (least significant bit) recovery operation.

In a multi-level cell (MLC) memory device where two or more data bits are stored in each memory cell, sudden power-off can arise during programming of MSB (most significant bit) data. In this case, LSB data stored at memory cells can be damaged. In an exemplary embodiment of the inventive concept, data stored at an LSB page sharing the same word line as an MSB page is backed up at a predetermined storage region.

In case of the above-described sudden power-off, a recovery operation on all damaged LSB data may be executed regardless of whether LSB data damaged by the sudden power-off is invalid data or not. However, information associated with the location at which the backup data is stored can also be damaged by the sudden power-off, thus hindering a recovery operation on all damaged LSB data. In this case, all backup data may be searched to find backup data corresponding to the damaged LSB data. Thus, it may take a lot of time to perform a recovery operation on all damaged LSB data.

In an exemplary embodiment of the inventive concept, upon programming of a currently programmed LSB page, a memory system 100 according to an exemplary embodiment of the inventive concept programs information indicating whether a previously programmed LSB page is valid data, together with the current LSB page. Thus, when a recovery operation due to the sudden power-off is performed, a recovery operation on invalid LSB pages may be skipped.

Also, upon programming of the LSB page, the memory system 100 programs location information indicating the location where a previously programmed LSB page is to be backed up, together with the LSB page. Thus, when a recovery operation due to the sudden power-off is performed, backed-up LSB pages may be located rapidly. Referring to FIG. 1, the memory system 100 includes a host 110 and a storage device 120. The storage device 120 includes a nonvolatile memory 121 and a controller 122.

The storage device 120 stores data from the host 110 at the nonvolatile memory 121 in response to a write request of the host 110. The storage device 120 sends data stored at the nonvolatile memory 121 to the host 110 in response to a read request of the host 110.

The nonvolatile memory 121 includes a user data region and an LSB backup region. The user data region may be used to store user data transferred from the host 110. The LSB backup region may be used to back up LSB data in preparation for the sudden power-off. Thus, the LSB backup region may be used to back up LSB data to prevent damage of the LSB data due to the sudden power-off during an MSB program operation.

The user data region and the LSB backup region may be implemented by NAND flash memory, PRAM, ReRAM, FRAM, PRAM, NOR flash memory, and the like. Also, the user data region and the LSB backup region may be both implemented by the same type of memories, respectively. Or, the user data region and the LSB backup region may be implemented by different types of nonvolatile memories.

The controller 122 controls the overall operation of the storage device 120. For example, when a write request is received from the host 110, the controller 122 receives write-requested data from the host 110, and may control the nonvolatile memory 121 such that the write-requested data is to be programmed at the nonvolatile memory 121. When a read request is received from the host 110, the controller 122 reads the read-requested data from the nonvolatile memory 121 to transfer it to the host 110. The controller 122 may include an LSB recovery manager 123.

The LSB recovery manager 123 controls an operation for recovering LSB data damaged due to the sudden power-off. When an LSB page is being programmed, the LSB recovery manager 123 judges whether a previously programmed LSB page is valid.

In a case where data of a previously programmed LSB page is valid data, the LSB recovery manager 123 controls the nonvolatile memory 121 such that data of a previously programmed LSB page is backed up at the LSB backup region. In this case, the LSB recovery manager 123 control the nonvolatile memory 121 so as to store address information, indicating the location where a previously programmed LSB page is backed up, at a spare area of the LSB page.

In a case where data of a previously programmed LSB page is invalid data, the LSB recovery manager 123 controls the nonvolatile memory 121 so as to store information (hereinafter, referred to as invalidation information), indicating that a previously programmed LSB page is an invalidated page, at a spare area of the LSB page to be programmed currently.

As described above, during a program operation of an LSB page, the memory system stores invalidation information of a previously programmed LSB page or stores address information indicating a location where a previously programmed LSB page is backed up, at a spare area of the LSB page to be programmed. Thus, at a recovery operation executed after the sudden power-off, the memory system 100 may skip a recovery search operation on invalidated LSB pages of damaged LSB pages. And, the memory system 100 may rapidly search backup data corresponding to data of damaged LSB pages.

Figure 2:
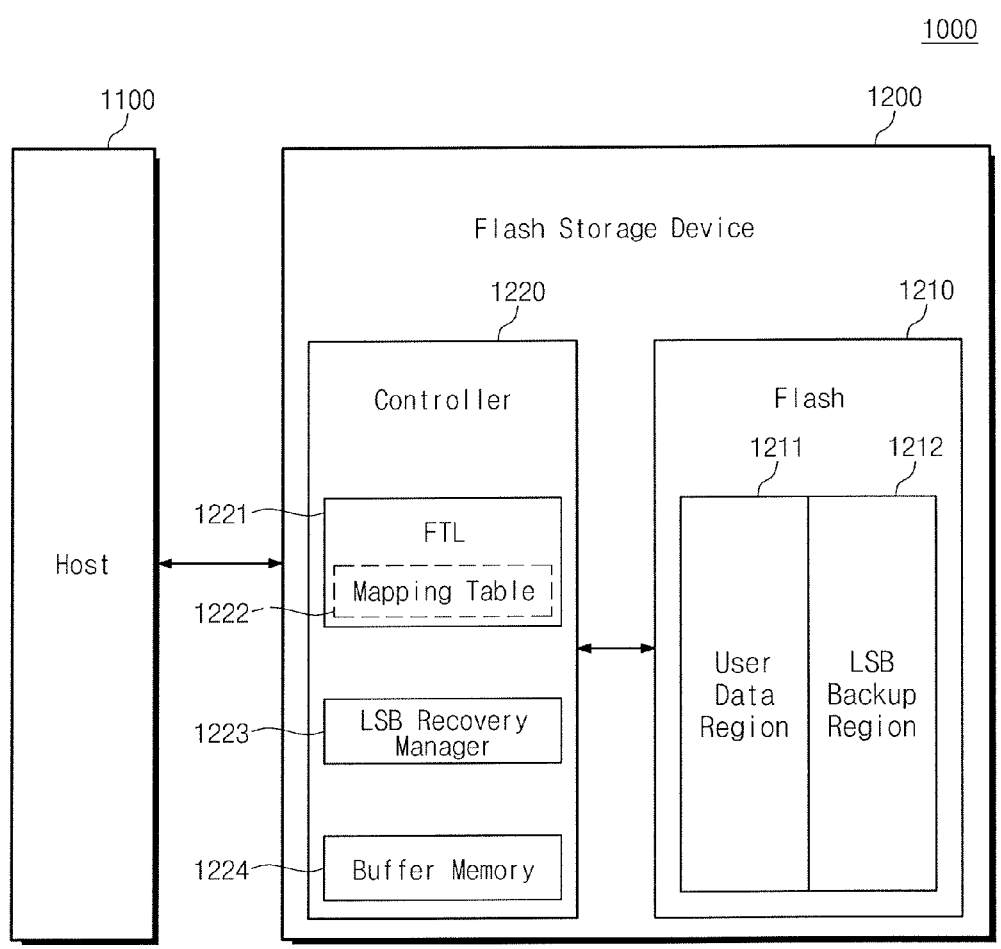
FIG. 2 is a block diagram of a flash memory system according to an embodiment of the inventive concept.

FIG. 2 is a block diagram schematically illustrating a flash memory system according to an exemplary embodiment of the inventive concept. In FIG. 2, a flash memory system 1000 may manage invalidation information of LSB pages and/or locations of backup data. A flash memory 1210 may be illustrated in FIG. 2 as an example of a nonvolatile memory 121.

Referring to FIG. 2, the flash memory system 1000 may include a host 1100 and a flash storage device 1200. The flash storage device 1200 may include a flash memory 1210 and a controller 1220.

The flash memory 1210 may perform an erase operation, a read operation, or a write operation according to the control of the controller 1220. The flash memory 1210 may comprise a memory cell array formed of a plurality of planes, each of which planes is formed of a plurality of pages.

In the flash memory 1210, each memory cell may store one bit of data or two or more bits of data. A memory cell storing one bit of data may be referred to as a single level cell (SCL) or as a single bit cell. A memory cell storing two or more bits of data may be referred to as a multi-level cell (MLC) or a multi bit cell.

The flash memory 1210 may include a user data region 1211 and an LSB backup region 1212. As described in FIG. 1, the user data region 1211 may be used to store user data, and the LSB backup region 1212 may be used to back up LSB data paired with an MSB page to be programmed. Herein, MSB and LSB pages sharing the same word line may be said to be 'paired'.

In an exemplary embodiment, the LSB backup region 1212 may be used to back up valid LSB pages of a plurality of LSB pages. The structure of the flash memory 1210 will be more fully described with reference to FIG. 3.

The controller 1220 controls the overall operation of the flash memory device 1200. The controller 1200 includes a flash translation layer (FTL) 1221, a mapping table 1222, an LSB recovery manager 1223, and a buffer memory 1224.

The flash translation layer 1221 converts a logical address provided from the host 1100 into a physical address of the flash memory 1210. Hereinafter, it is assumed that the flash translation layer 1221 manages data page by page. Thus, the flash translation layer 1221 receives a logical page number LPN from the host 1100 and converts it into a physical page number PPN of the flash memory 1210.

The mapping table 1222 of the flash translation layer 1221 manages mapping information between logical and physical page numbers associated with data stored at the flash memory 1210. For example, when a write request is received from the host 1100, the flash translation layer 1221 converts a logical page number LPN of write-requested data into a physical page number PPN, and stores mapping information between the logical page number LPN and the physical page number PPN at the mapping table 1222.

The LSB recovery manager 1223 judges invalidation of a previously programmed LSB page while a program operation on an LSB page is executed. The LSB recovery manager 1223 may determine backup of data of the previously programmed LSB page to the LSB backup region 1212, according to whether the previously programmed LSB page is invalid. For ease of description, the immediately previously programmed LSB page may be referred to as the 'previous LSB page', and the LSB page to be programmed currently may be referred to as the 'current LSB page'.

For example, in a case where data of the previous LSB page is valid data, the LSB recovery manager 1223 may control the flash memory 1210 such that data of the previous LSB page is backed up at the LSB backup region 1212. In this case, the LSB recovery manager 1223 stores address information, indicating the location of the LSB backup region 1212 where the previous LSB page is to be backed up, at the spare area of the current LSB page. Thus, when a recovery operation is performed, the flash storage device 1200 may rapidly find the location where a damaged LSB page is backed up, by referring to a spare area of a current LSB page.

In a case where data of a previous LSB page is invalid data, the LSB recovery manager 1223 stores information (i.e., invalidation information), indicating that the previous LSB page is an invalid page, at a spare area of the current LSB page. Thus, when a recovery operation is performed, the flash storage device 1200 skips a recovery operation on an invalidated LSB page, by referring to a spare area of a current LSB page.

The buffer memory 1224 temporarily stores data read out from the flash memory 1210 or data provided from the host 1100. The buffer memory 1224 may be used to drive firmware such as the flash translation layer (FTL). The buffer memory 1224 may be formed of DRAM, SRAM, MRAM, PRAM, and/or the like.

As described above, upon programming of a current LSB page, the flash storage device 1200 stores invalidation information of a previous LSB page or stores backup location information of the previous LSB page, at a spare area of the current LSB page. The flash storage device 1200 can skip a recovery operation on an invalidated LSB page or rapidly search a backed-up LSB page.

Figure 3:
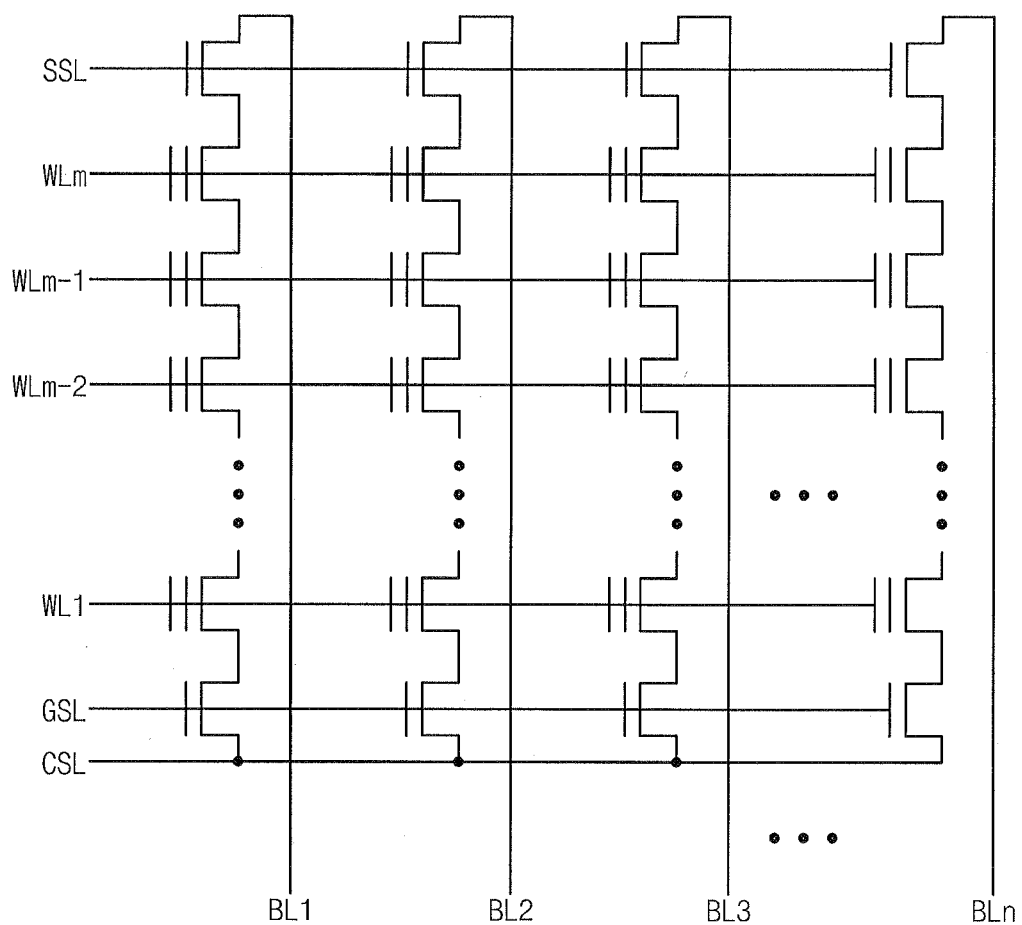
FIGS. 3 and 4 are circuit diagrams illustrating a flash memory in FIG. 2.
Figure 4:
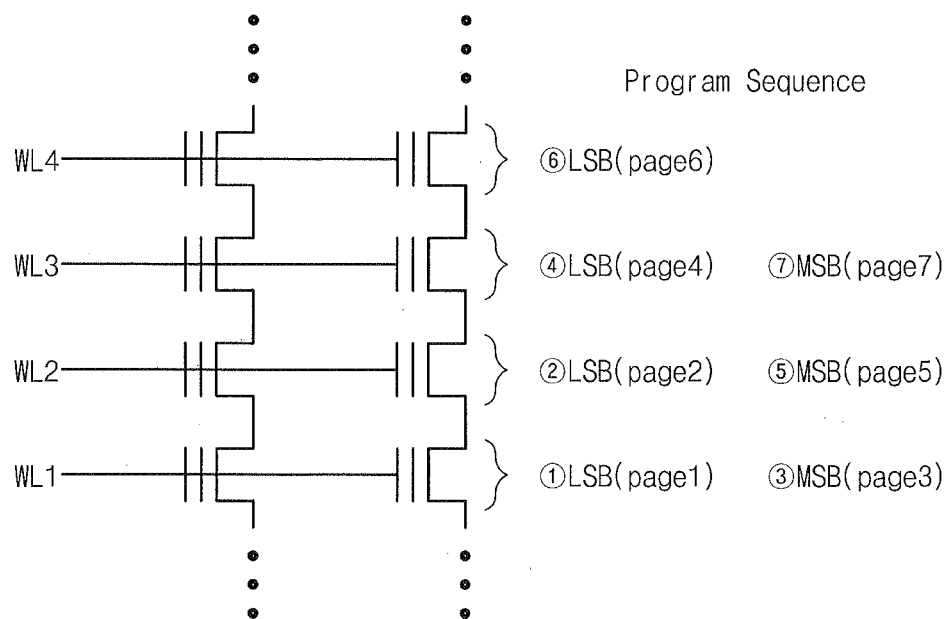

FIGS. 3 and 4 are circuit diagrams illustrating a block of NAND strings comprised of memory cells in a flash memory in FIG. 2. For ease of illustration, the user data region 1211 is exemplarily illustrated in FIGS. 3 and 4. However, an LSB backup region 1212 may be also implemented to have the same physical structure type as shown in FIGS. 3 and 4. In other exemplary embodiments, memory cells in FIG. 3 can be divided to form the user data region 1211 and the LSB backup region 1212.

Referring to FIG. 3, the memory block including user data region 1211 includes a plurality of memory cells, string selection transistors, and ground selection transistors. Memory cells of the same page may be connected to each other via a word line. Memory cells connected with the same word line may form one or more pages.

In a single-level cell (SLC) where one bit is stored at a memory cell, a set of memory cells connected with one word line may form a single page. In a multi-level cell (MLC) manner where two or more bits are stored at each memory cell, a set of memory cells connected with one word line may form a plurality of pages.

The gate of the string selection transistor (SST) is connected with a string selection line SSL. The drain of each string selection transistor is connected with a corresponding bit line BLi (wherein i is one of 1 to n). The gate of the ground selection transistor (GST) may be connected with a ground selection line GSL. The drain of the ground selection transistor is connected with a common source line CSL.

In FIG. 4, there is illustrated a program sequence of the word lines of user data region 1211. Hereinafter, it is assumed that program operations performed according to a 2-bit MLC storage manner by which each memory cell stores 2-bit data.

In the 2-bit MLC storage manner, memory cells sharing the same one word line may form two pages. Thus, as illustrated in FIG. 4, memory cells sharing the same word line may form one LSB page and one MSB page.

A flash memory 1210 may perform a program operation according to the exemplary sequence illustrated in FIG. 4 to minimize influence of the program disturbance generated during a program operation. Thus, a program operation may be performed in an order of ①, ②, ③, ④, etc. In FIG. 4, "LSB" indicates an LSB program operation, and "MSB" indicates an MSB program operation.

With the program sequence illustrated in FIG. 4, an LSB program operation on an adjacent word line may be performed, and an MSB program operation may be carried out.

For example, an LSB program operation on a second word line WL2 may be performed, and an MSB program operation on a first word line WL1 may be carried out. In general, MSB-programmed memory cells may be affected by the program disturbance at an LSB program operation on an adjacent word line. However, in accordance with the program sequence in FIG. 4, before an MSB program operation is carried out, an LSB program operation on an adjacent word line has already been performed. This may mean that influence of the program disturbance is minimized.

In case of the above-described program sequence, each one word line may correspond to paired pages. For example, a first word line WL1 may correspond to a first page being an LSB page and a third page being an MSB page. In this case, as described above, the first page and the third page may be paired. The first page may be a paired page with the third page, and the third page may be a paired page with the first page.

In FIGS. 3 and 4, a program operation on the user data region 1211 is described. However, the LSB backup region 1212 may be also programmed in the same manner as the user data region 1211 described in FIG. 4.

In other exemplary embodiments, the LSB backup region 1212 can have a program sequence different from that of the user data region 1211 described in FIG. 4. For example, the LSB backup region 1212 may be programmed in an order of an LSB program operation of a first word line WL1, followed by an LSB program operation of a second word line WL2, followed by an MSB program operation of the second word line WL2, etc.

Figure 5:
FIG. 5 is a diagram illustrating a structure of an LSB page.

FIG. 5 is a diagram illustrating the structure of an LSB page. Referring to FIG. 5, an LSB page may include a user data area and a spare area, sharing the same wordlines (see wordlines in FIG. 3).

The user data area may be used to store write-requested data of a host 1100 (refer to FIG. 2). The spare area corresponding to the write-requested data sharing the same wordline may be used to store invalidation information of the previous LSB page or address information associated with the location where the previous LSB page is backed up.

For example, it is assumed that the previous LSB page is the second page ("page2" refer to FIG. 4) and a current LSB page is the fourth page ("page4" refer to FIG. 4). In a case where data stored at the second page ("page2") is invalidated data, information (i.e., invalidation information) indicating that data stored at the second page ("page2") is invalid data, may be stored at a spare area of the fourth page ("page4"). In the event that data stored at the second page ("page2") is valid data, address information associated with the location where data of the second page ("page2") is backed up may be stored at a spare area of the fourth page ("page4").

Figure 6:
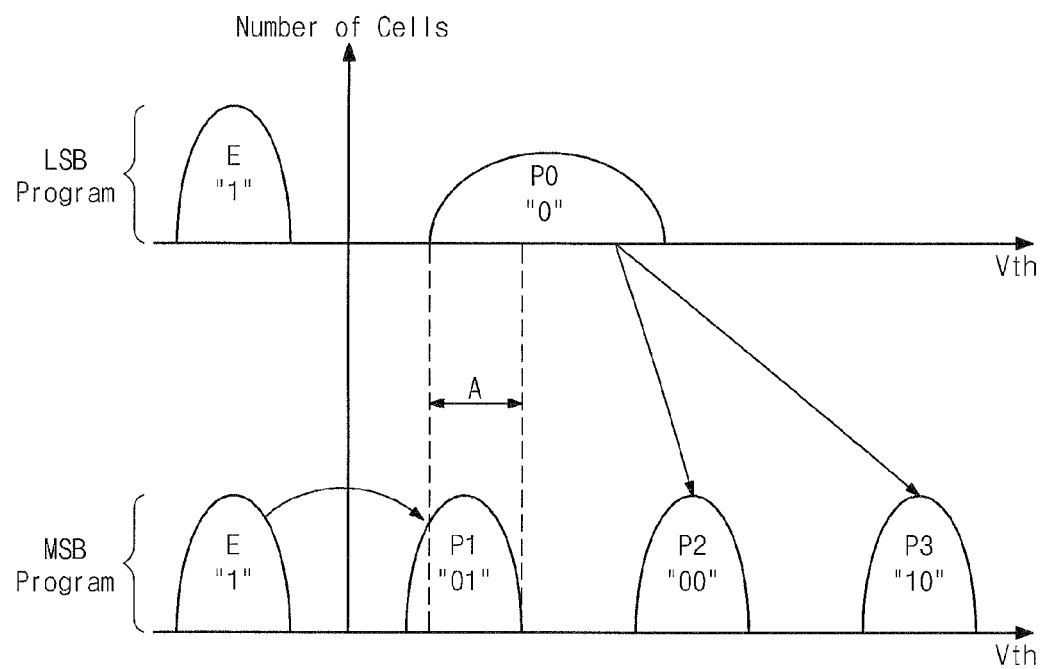
FIG. 6 is a pair of threshold voltage distribution graph illustrating an example where data stored at an LSB page is damaged at sudden power-off.

FIG. 6 is a pair of threshold voltage distribution graphs illustrating an example where data stored at an LSB page is damaged at sudden power-off. In FIG. 6, the upper graph illustrates a threshold voltage distribution when an LSB program operation is executed and a the lower graph illustrates a threshold voltage distribution when an MSB program operation is performed.

Before an LSB program operation has been performed, all memory cells have an erase state E. After an LSB program operation has been performed, memory cells having an erase state E may maintain the erase state E or be programmed to an initial program state P0. In this case, memory cells having the erase state E may represent a logical LSB data of '1' (or '11'), and memory cells having the initial program state P0 may represent logical LSB data of '0' (i.e., '_0' or '00' or '10').

After an MSB program operation is performed, memory cells previously having an erase state E may maintain the erase state E or be programmed to a first program state P1. Also, memory cells previously having the initial program state P0 may be programmed to a second program state P2 or to a third program state P3.

The first, second, and third program states P1, P2, and P3 may represent data of '01', data of '00', and data of '10', respectively. In data of 'LR', a right data bit 'R' may indicate an LSB data bit, and a left data bit 'L' may indicate an MSB data bit. For example, memory cells having the first program state P1 may store data of '01', in which a right data bit '1' may indicate an LSB data bit and a left data bit '0' may indicate an MSB data bit.

If a sudden power-off occurs during an MSB program operation, LSB data of memory cells, belonging to a region 'A', from among memory cells programmed to the first program state P1 may be damaged. The reason may be that LSB data of memory cells belonging to the region 'A' is changed from '0' to '1' due to the MSB program operation.

To prevent the above-described phenomenon, a flash storage device according to an embodiment of the inventive concept may assign a part of a flash memory 1210 (refer to FIG. 2) to serve as an LSB backup region 1212 (refer to FIG. 2). Thus, when an MSB program operation is performed, the flash storage device 1200 may include the LSB backup region 1212 for backing up data stored at an LSB page paired with a page to be MSB-programmed.

As described with reference to FIGS. 2 to 4, the flash storage device 1210 may back up data stored at an LSB page at the LSB backup region 1212 only when data stored at the LSB page paired with a page to be MSB-programmed is invalidated data.

Below, a program operation of the flash storage device according to an exemplary embodiment of the inventive concept will be more fully described with reference to FIGS. 7 to 17.

A flash storage device to be described later may store invalidation information of the previous LSB page at a spare area of the current LSB page.

FIGS. 7 to 10 are diagrams illustrating an LSB program operation of the flash storage device of FIG. 2. Below, there will be described a program method for storing invalidation information of the previous LSB page at the spare area of the current LSB page when data stored at the previous LSB page is invalidated due to a program operation on the current LSB page.

It is assumed here that a flash storage device 1200 performs a program operation according to the sequence described with reference to FIG. 4. Also, it is assumed here that data was programmed at first to fifth pages (page1 to page5) and that write-requested data is to be programmed at a sixth page (page6) being an LSB page.

Figure 7:
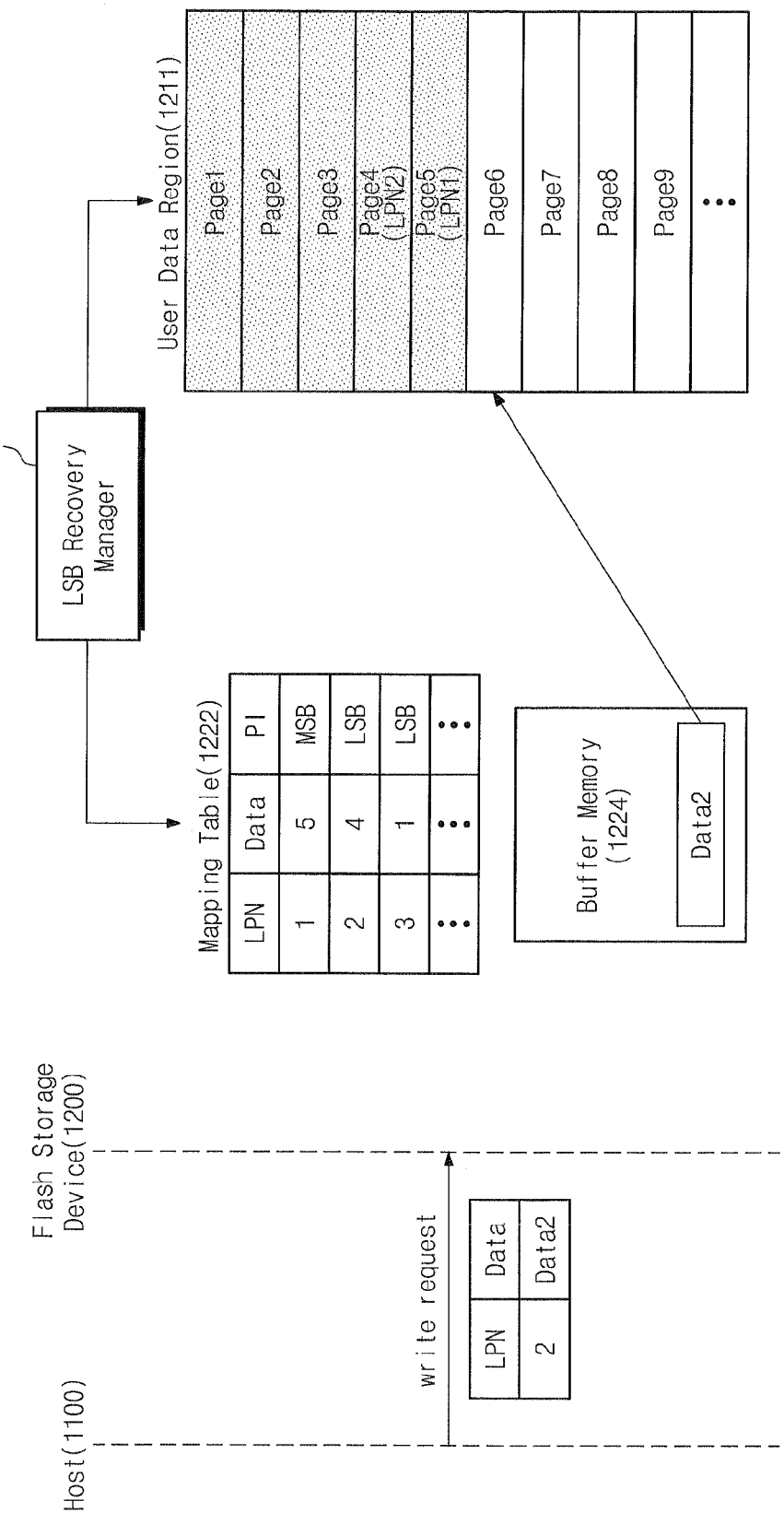
FIGS. 7 to 10 are diagrams illustrating an LSB program operation of the flash storage device of FIG. 2.

Referring to FIG. 7, the flash storage device 1200 receives a write request from a host 1100. At the same time, the flash storage device 1200 may receive second data Data2 having a logical page number LPN of 2 from the host 1100. The second data Data2 transferred from the host 1100 may be temporarily stored at a buffer memory 1224.

An LSB recovery manager 1223 may check whether the second data Data2 write-requested has already been programmed at any page of pages of a user data region 1211. Thus, the LSB recovery manager 1223 checks whether a page for storing the second data Data2 is an LSB page.

In an exemplary embodiment, the LSB recovery manager 1223 judges whether a page for storing the second data Data2 is an LSB page, by referring to a mapping table 1222.

In detail, as illustrated in FIG. 7, the mapping table 1222 may manage a logical page number LPN, a physical page number PPN, and page information PI. For example, referring to the mapping table 1222, data having a logical page number LPN of 1 corresponds to a page, having a physical page number PPN of 5, as an MSB page. Herein, the page having a physical page number PPN of 5 may indicate the fifth page (page5) of a user data region 1211.

The flash storage device 1200 performs a program operation according to the sequence described in FIG. 4, and may manage information about programmed pages of pages of the user data region 1211. Thus, the LSB recovery manager 1223 may determine a page at which the second data Data2 write-requested is to be programmed and determine whether the page is an LSB page.

In other exemplary embodiments, the LSB recovery manager 1223 may receive information about the location where the second data Data2 is to be programmed, from a flash memory 1210 (refer to FIG. 2).

In a case where write-requested data is to be programmed at an LSB page, the LSB recovery manager 1223 checks whether data of the previous LSB page is invalidated by the second data Data2 write-requested. In this case, the LSB recovery manager 1223 judges whether data of the previous LSB page is invalidated by the second data Data2, by referring to the mapping table 1222.

For example, referring to a mapping table 1222 in FIG. 7, a fourth page (page4) has the same logical page number LPN as the second data Data2. Also, the fourth page (page 4) is an LSB page. This means that when the second data Data2 is programmed at a sixth page (page6), data stored at the fourth page (page4) being an LSB page is invalidated by the second data Data2. Thus, the LSB recovery manager 1223 may judge whether data of the fourth page (page4) being the previous LSB page is invalidated by the second data Data2, by referring to the mapping table 1222.

Figure 8:
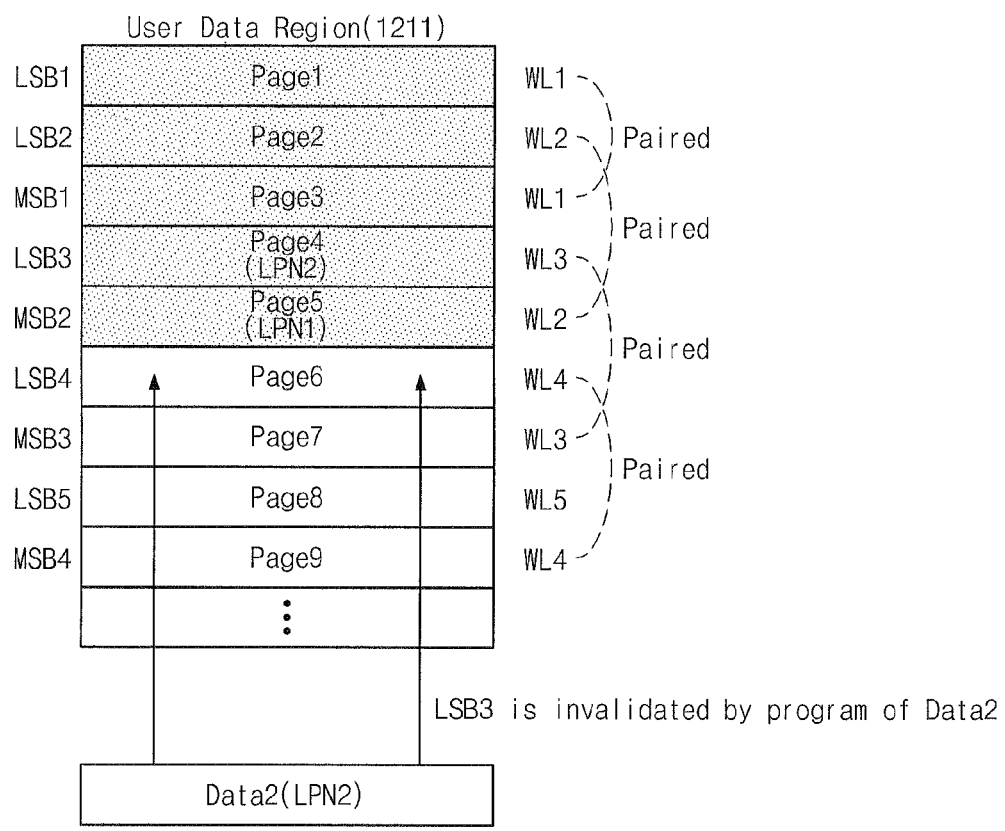

The user data region 1211 in FIG. 1 is illustrated in FIG. 8 in detail. For ease of description, an LSB page corresponding to an nth word line WLn may be referred to as an nth LSB page LSBn, and an MSB page corresponding to the nth word line WLn may be referred to as an nth MSB page MSBn.

For example, since a first page (page1) is an LSB page corresponding to a first word line WL1, it may be referred to as a first LSB page LSB1. Since a second page (page2) is an LSB page corresponding to a second word line WL2, it may be referred to as a second LSB page LSB2. Since a third page (page3) is an MSB page corresponding to the first word line WL1, it may be referred to as a first MSB page MSB1.

As illustrated in FIG. 8, if the second data Data2 is programmed at the sixth page (page6), data stored at the fourth page (page4) may be invalidated. Thus, if the second data Data2 is programmed at a fourth LSB page LSB4, data stored at a third LSB page LSB3 being a previous LSB page of the fourth LSB page LSB4 may be invalidated.

Figure 9:
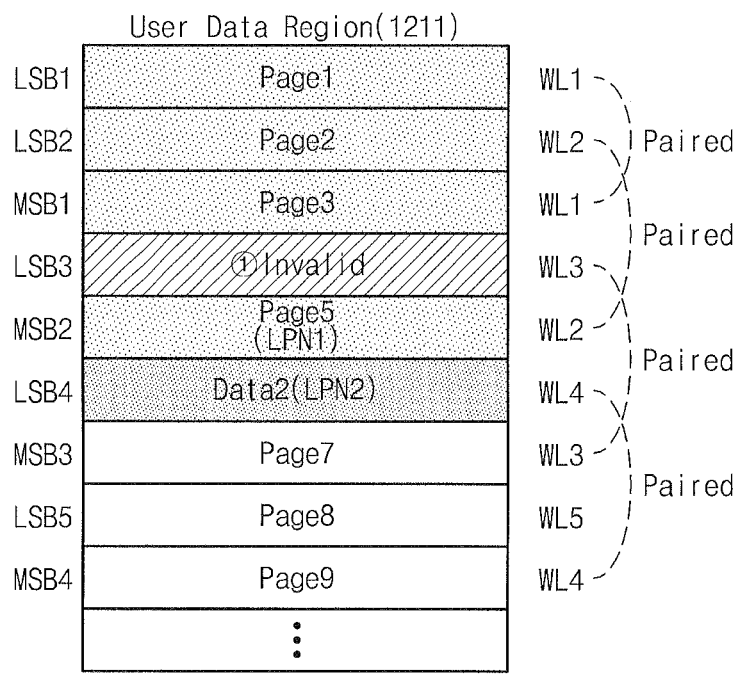
Figure 10:
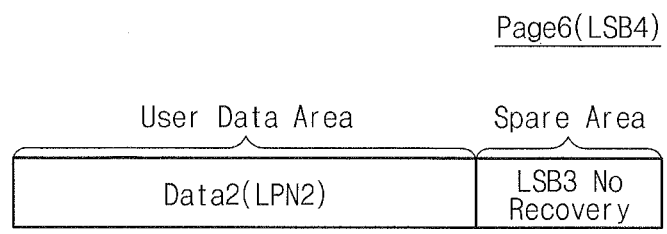

Illustrated in detail in FIGS. 9 and 10, is the data stored at the user data region 1211 and the data stored at the fourth LSB data LSB4 when programming of the second data Data2 at the fourth LSB page LSB4 is completed.

As illustrated in FIG. 9, in case that programming of the second data Data2 at the fourth page is completed, data stored at a third LSB page LSB3 may be invalidated. In this case, although sudden power-off occurred during an MSB program operation of a third MSB page MSB3, data stored at the third LSB page LSB3 paired with the third MSB page MSB3 need not be recovered. The reason is that data stored at the third LSB page LSB3 is invalidated data.

The flash storage device 1200 according to an embodiment of the inventive concept need not perform an operation of backing up data stored at the third LSB page LSB3 before an MSB program operation of the third MSB page MSB3 is performed. Also, when an LSB program operation of a fourth LSB page LSB4 is performed, the flash storage device 1200 may store information, indicating that the third LSB page LSB3 is invalidated, at a spare area of the fourth LSB page LSB4.

For example, as illustrated in FIG. 10, the flash storage device 1200 stores the second data Data2 at a user data area of the fourth LSB page LSB4 and information indicating that the third LSB page LSB3 need not be recovered (or, that the third LSB page LSB3 is invalidated), at the spare area of the fourth LSB page LSB4.

Thus, in a case where there is performed a recovery operation associated with sudden power-off that occurred during an MSB program operation of the third MSB page MSB3, the LSB recovery manager 1223 need not perform a recovery operation on the third LSB page LSB3, based on information stored at a spare area of the fourth LSB page LSB4.

As a result, the flash storage device 1200 can skip an unnecessary recovery operation on invalidated data, by writing invalidation information of the previous LSB page at a spare area of a current LSB page.

Below, a flash storage device will be described that stores a backup location of the previous LSB page at a spare area of the current LSB page.

Figure 11:
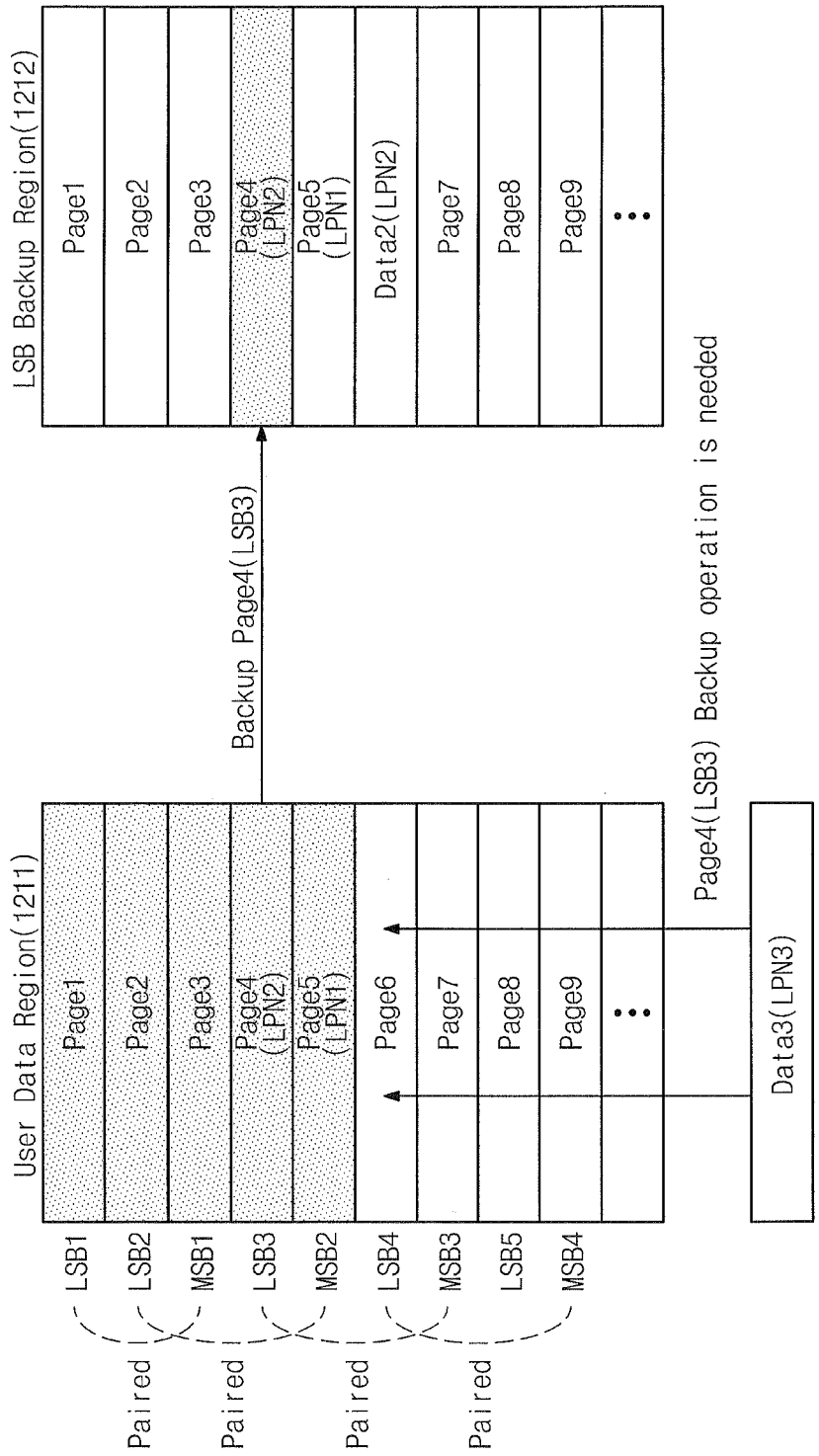
FIGS. 11 and 12 are diagrams illustrating an LSB program operation of the flash storage device of FIG. 2.
Figure 12:
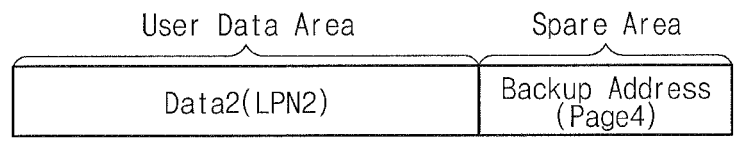

FIGS. 11 and 12 are diagrams illustrating an LSB program operation of the flash storage device of FIG. 2. There will be described a program method for storing a location in which data stored at the previous LSB page is to be backed up, at a spare area of the current LSB page when data stored at the previous LSB page is backed up.

It is assumed here that a flash storage device 1200 performs a program operation according to the sequence described with reference to FIG. 4. Also, it is assumed here that data was programmed at the first to fifth pages (page1 through page5) and write-requested data is to be programmed at a sixth page (page6) being an LSB page.

Unlike as in FIGS. 7 to 10, it is assumed here that third data Data3 write-requested corresponds to a logical page number LPN of 3 which does not coincide with logical page numbers LPN corresponding to data stored at a user data region 1211.

Referring to FIG. 11, a logical page number LPN of the third data Data3 may be 3 and a logical page number LPN of data stored at the third LSB page LSB3. Thus, although the third data Data3 is programmed at a fourth LSB page LSB4, data stored at the third LSB page LSB3 may be still valid.

In this case, if sudden power-off occurs during programming of a third MSB page MSB3, data of the third LSB page LSB3 storing valid data can be damaged. Thus, before an MSB program operation on the third MSB page MSB3 is programmed, the third LSB page LSB3 may be backed up.

In this case, when an LSB program operation on a fourth LSB page LSB4 is performed, the flash storage device 1200 may write information indicating a backup location of data stored at the third LSB page LSB3, at the spare area of the fourth LSB page LSB4.

In this example, as illustrated in FIG. 11, it is assumed here that data stored at the third LSB page LSB3 is backed up at the fourth page of an LSB backup region 1212. In this case, as illustrated in FIG. 12, when an LSB program operation on the fourth LSB page LSB4 is performed, the flash storage device 1200 writes information (or, a backup address), indicating that the third LSB page LSB3 was backed up at the fourth page of the LSB backup region 1212, at the spare area of the fourth LSB page LSB4.

Thus, when a recovery operation after the sudden power-off occurred during an MSB program operation of the third MSB page MSB3, the LSB recovery manager 1223 can rapidly find a backup location of data of the third LSB data LSB3 based on a spare area of the fourth LSB page LSB4.

Figure 13:
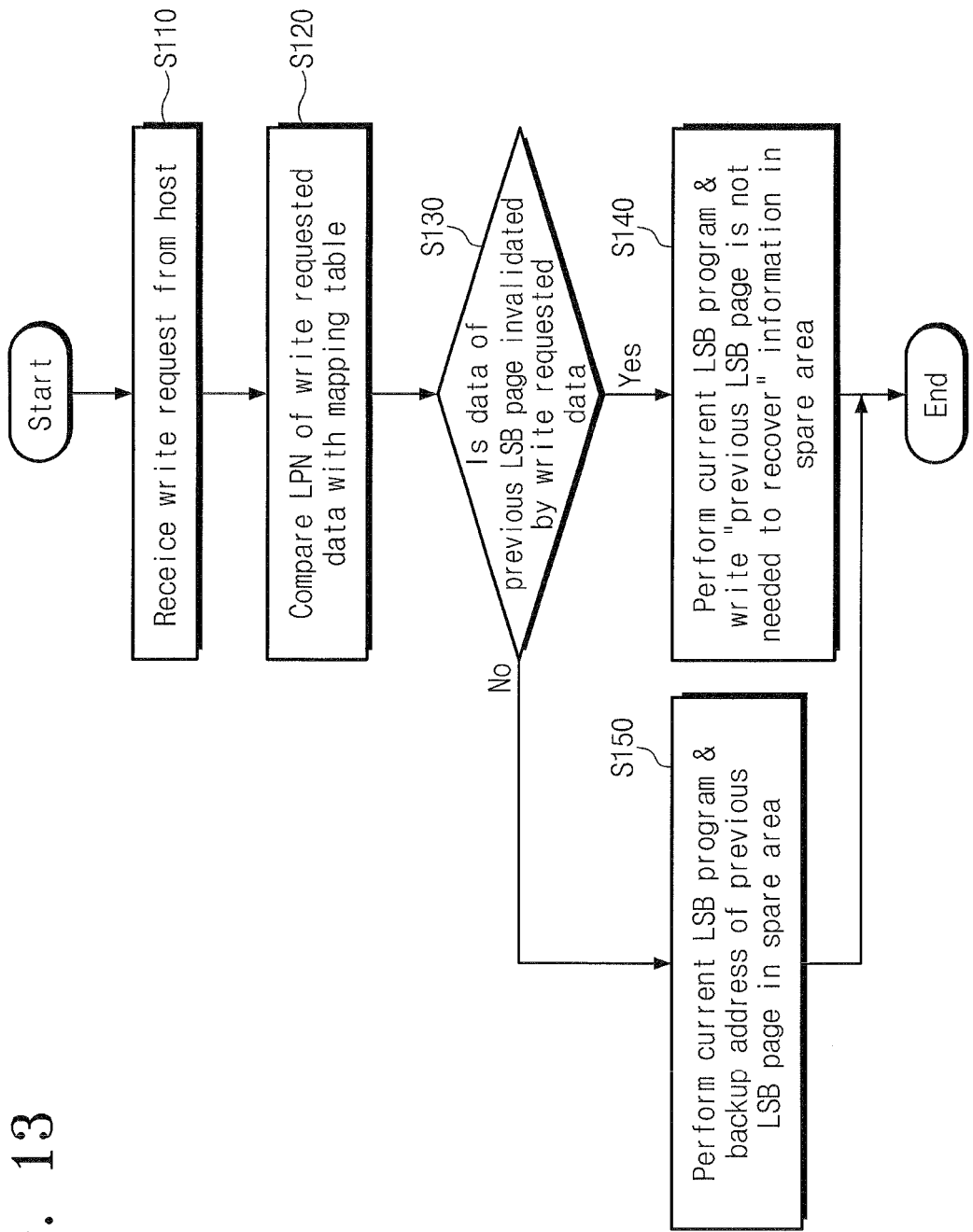
FIG. 13 is a flowchart illustrating a program operation of a flash storage device according to an embodiment of the inventive concept.

FIG. 13 is a flowchart illustrating a program operation of a flash storage device according to an embodiment of the inventive concept. Below, a program operation of a flash storage device according to an embodiment of the inventive concept will be more fully described with reference to FIGS. 2 to 12.

In step S110, a flash storage device 1200 receives a write request from a host 1100. In this case, the flash storage device 1200 receives write-requested data with a logical page number LPN of the write-requested data.

In step S120, the flash storage device 1200 compares the logical page number LPN of the write-requested data with a logical page number LPN managed at a mapping table 1222. An LSB recovery manager 1223 judges whether the write-requested data is programmed at an LSB page and whether data stored at a previous LSB page is invalidated by a program operation on a current LSB page, by comparing the logical page number LPN of the write-requested data with the logical page number LPN of the mapping table 1222.

In decision step S130, whether data stored at the previous LSB page is invalidated by the write-requested data is judged.

In a case where data stored at the previous LSB page is invalidated by the write-requested data (YES branch of the decision step S130), a program operation on the current LSB page may be performed. Herein, 'a program operation on the current LSB page' may mean an operation of programming the write-requested data at an LSB page. In this case, in step S140 (YES branch of the decision step S130), the write-requested data is stored at a user data region of the LSB page, and information (indicating that a recovery operation on a previous LSB page is not required) may be written together.

In case that data stored at the previous LSB page is still valid (NO branch of the decision step S130), the write-requested data may be programmed at the LSB page. In this case, in step S150, the write-requested data may be stored at the user data region of the LSB page, and backup information of data of a previous LSB page may be stored at a spare area of the LSB page.

The flash storage device 1200 may skip a recovery operation on an invalidated LSB page or rapidly find a backed-up LSB page.

The above description may be understood to be exemplary. However, the inventive concept is not limited thereto. Below, various applications and embodiments of the inventive concept will be described.

FIGS. 14 to 17 are diagrams illustrating a flash storage device having a program unit of a plurality of pages. A flash storage device to be described with reference to FIGS. 14 to 17 may be similar to that in FIG. 2. In FIGS. 14 to 17, constituent elements that are similar to those in FIG. 2 may be marked by the same reference numerals. A flash storage device described with reference to FIGS. 2 to 13 may have a program unit formed of one plane, and a flash storage device to be described with reference to FIGS. 14 to 17 may have a program unit formed of four planes.

Figure 14:
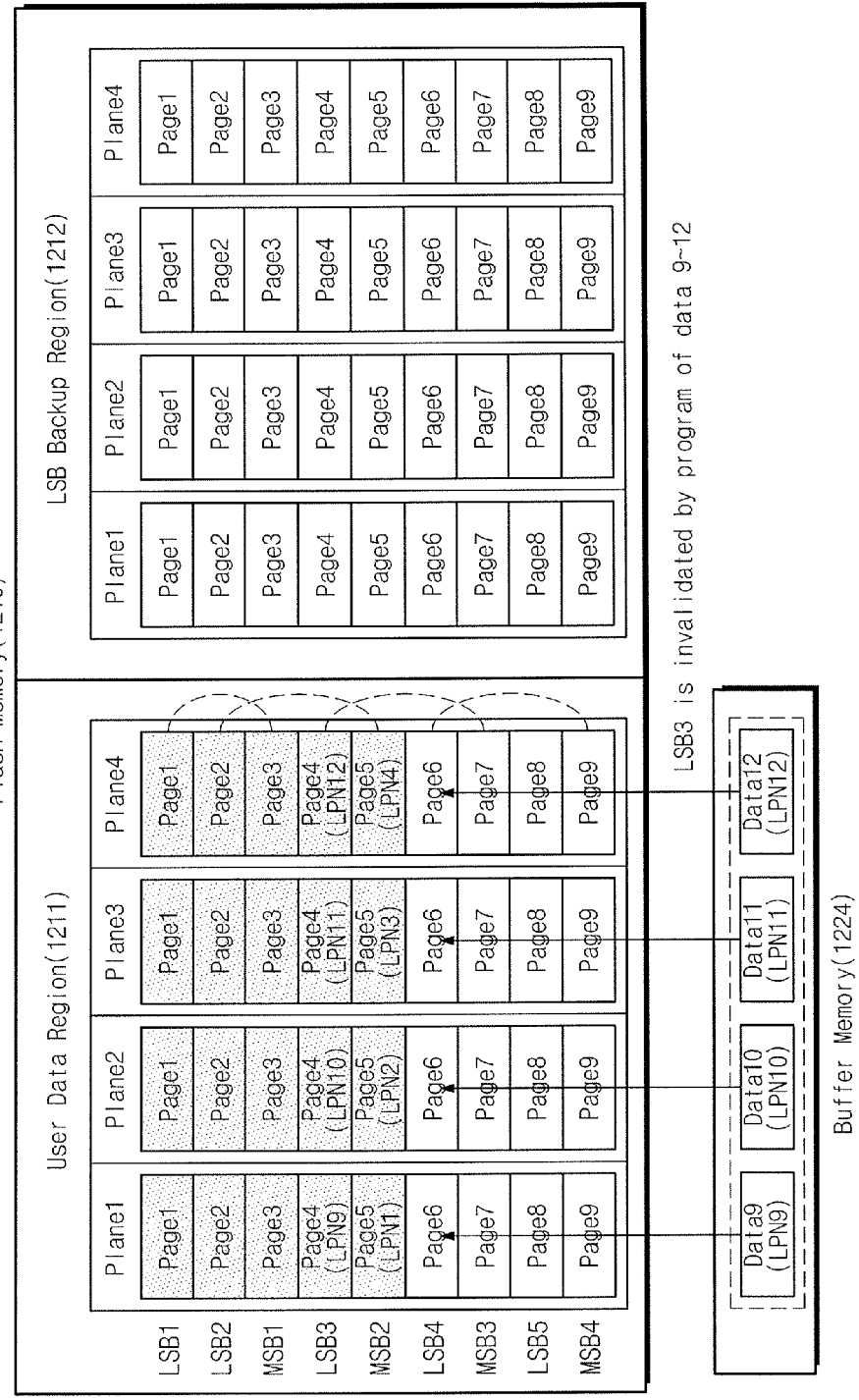
FIGS. 14 to 17 are diagrams illustrating a flash storage device having a program unit of a plurality of pages.
Figure 15:
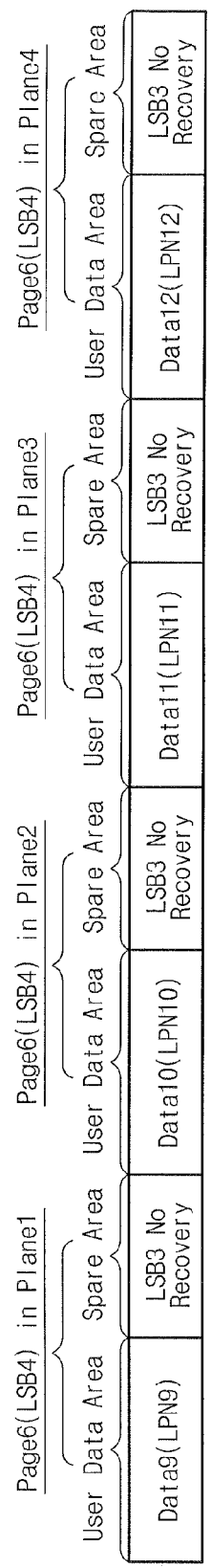

In FIGS. 14 and 15, a program method of a flash storage device according to an embodiment of the inventive concept will be described under the assumed exemplary conditions that data stored at a previous LSB page is invalidated by a program operation on a current LSB page.

Referring to FIG. 14, a flash memory 1210 includes a user data region 1211 and an LSB backup region 1212, each of which has first to fourth planes. Each plane may include a plurality of pages.

It is assumed here that $9^{th}$ to $12^{th}$ data Data9 to Data12 are temporarily stored in a buffer memory 1224. Also, it is assumed here that data is already stored at $1^{st}$ to $5^{th}$ pages (page1 through page5) of a user data region 1211. In this case, it is assumed that logical page numbers LPN of data stored at fourth pages (page4) of the first to fourth planes (plane1 through plane4) are equal to logical page numbers LPN of the $9^{th}$ to $12^{th}$ data Data9 to Data 12.

In this case, if the $9^{th}$ to $12^{th}$ data Data9 to Data12 are programmed at the fourth pages LSB4 (or page6), data stored at third pages LSB3 (page4) may be invalidated.

Thus, as described with reference to FIGS. 7 to 10, information indicating that data stored at a third LSB page is invalidated or that a recovery operation on the third page is not required is written at a spare area of each of the fourth LSB pages LSB4.

For example, as illustrated in FIG. 15, the $9^{th}$ to $12^{th}$ data Data9 to Data12 is to be stored at user data areas of the fourth LSB pages LSB4 of the first to fourth planes, and information indicating that a recovery operation on the third LSB page is not required may be written at spare areas thereof, respectively. Thus, the flash storage device 1200 may skip a recovery operation on an invalidated (third) LSB page.

Figure 16:
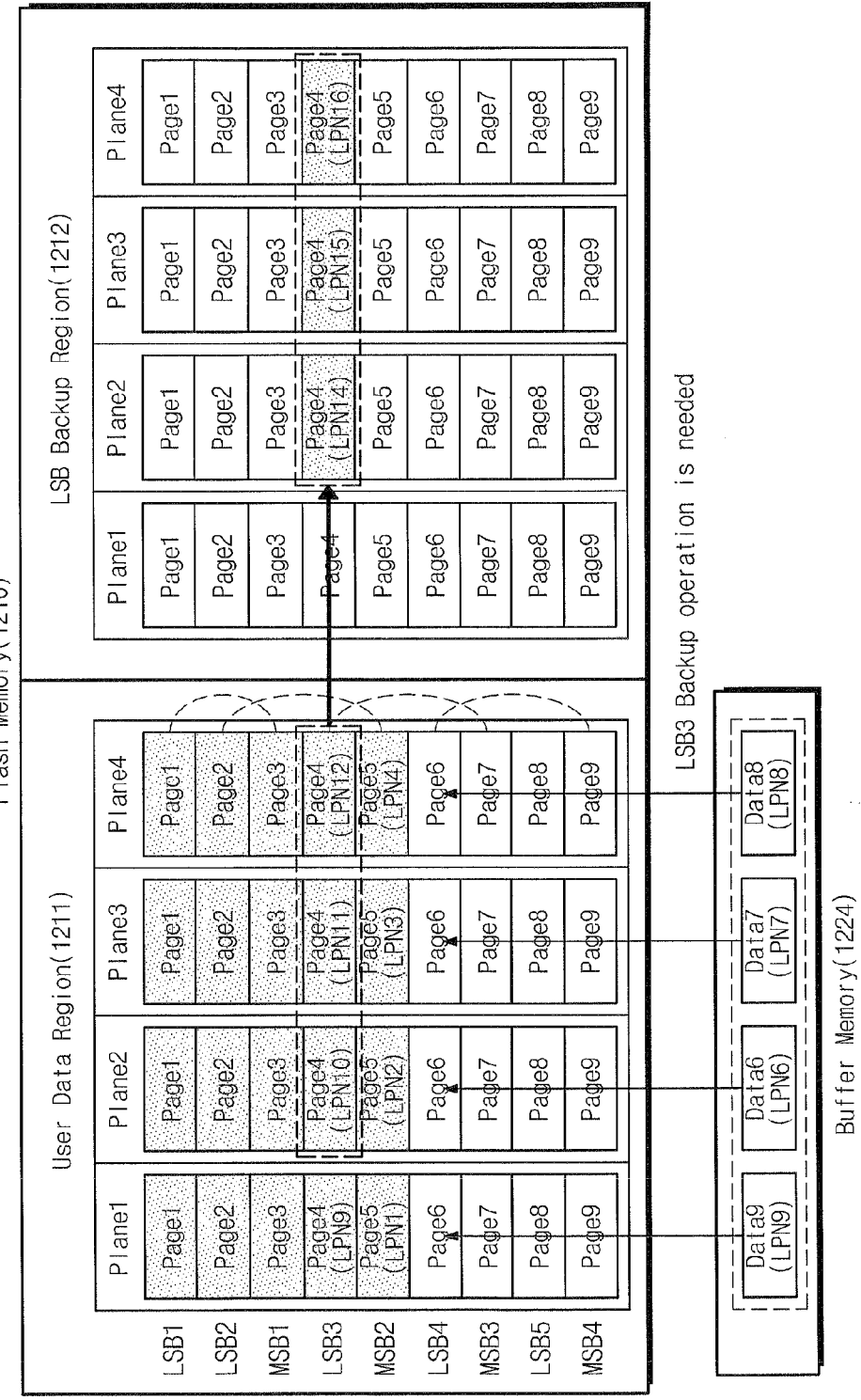
Figure 17:
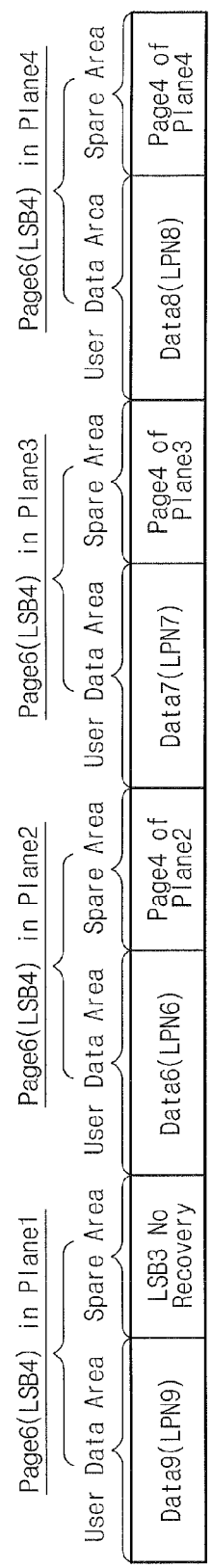

In FIGS. 16 and 17, a program method of the flash storage device will be described under the assumed exemplary conditions that some data stored at the previous LSB page is still valid.

In FIG. 16, it is assumed that $9^{th}$ data Data9, $6^{th}$ data Data6, $7^{th}$ data Data7, and $8^{th}$ data Data8 are temporarily stored at the buffer memory 1224. Also, it is assumed that the $9^{th}$ data, the $6^{th}$ data, the $7^{th}$ data, and the $8^{th}$ data are to be stored at a fourth LSB page LSB4 of the first plane, a fourth LSB page LSB4 of the second plane, at a fourth LSB page LSB4 of the third plane, and at a fourth LSB page LSB4 of the fourth plane, respectively.

With this assumption, if data stored at the buffer memory 1224 is stored at the fourth pages LSB4 of the user data region 1211, a third LSB page LSB3 of the first plane may be invalidated by the $9^{th}$ data Data9 (as in the example illustrated in FIG. 15 above). However, data stored at third LSB pages LSB3 of the second, third, and fourth planes may be still valid.

Thus, as described with reference to FIGS. 7 to 10, information indicating that data stored at the third LSB page is invalidated or that a recovery operation on the third LSB page is not required may be written at a spare area of a fourth LSB page LSB4 of the first plane.

However, data stored at the fourth LSB pages LSB4 of the second to fourth planes must be backed up to an LSB backup region 1212 before an MSB program operation on third MSB pages MSB3 are programmed.

Thus, as described with reference to FIGS. 11 and 12, data stored at the fourth LSB pages LSB4 of the second, third and fourth planes of the user data region 1211 may be backed up to the fourth LSB pages LSB4 of the second, third and fourth planes.

In this case, as illustrated in FIG. 17, information indicating that a recovery operation on a third LSB page of first plane Plane1 is not required may be written at the spare area of the fourth LSB page LSB4 of the first plane Plane1. Also, information indicating a backup location of data stored at the third LSB page LSB3 of the second, third and fourth planes may be written at spare areas of the fourth LSB pages LSB4 of the second, third, and fourth planes, respectively.

Accordingly, the flash storage device 1200 according to an embodiment of the inventive concept may skip a recovery operation on an invalidated LSB page (and plane) or rapidly find a backed-up LSB page.

Figure 18:
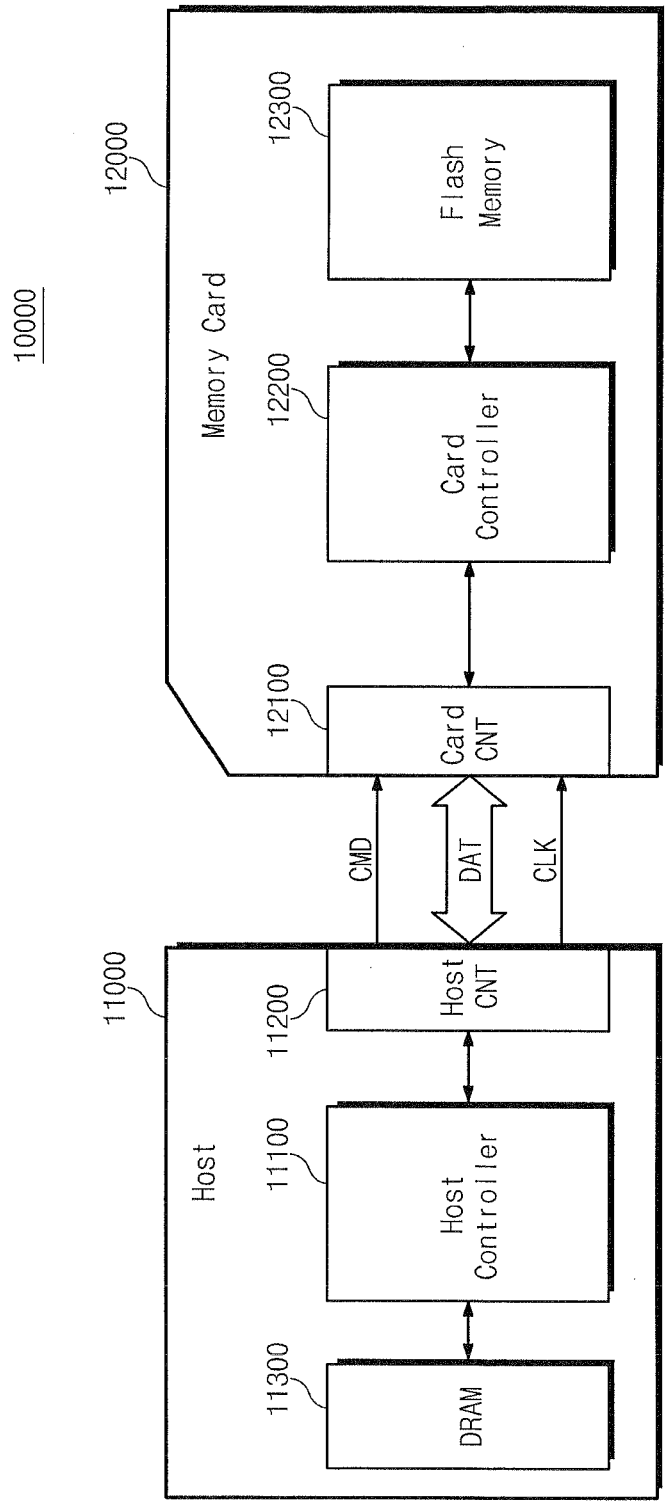
FIG. 18 is a block diagram schematically illustrating a memory card system to which a flash memory system according to an embodiment of the inventive concept is applied.

FIG. 18 is a block diagram schematically illustrating a memory card system in which a flash memory system according to an embodiment of the inventive concept is embodied. The memory card system 10000 includes a host 11000 and a memory card 12000. The host 11000 includes a host controller 11100, a host connection unit 11200, and a DRAM 11300.

The host 11000 can write data in the memory card 12000 and read data from the memory card 12000. The host controller 1110 can send a command (e.g., a write command), a clock signal CLK generated from a clock generator (not shown) in the host 11000, and data DAT to the memory card 12000 via the host connection unit 11200. The DRAM 11300 may be a main (system) memory of the host 11000.

The memory card 12000 may include a card connection unit 12100, a card controller 12200, and a flash memory 12300. The card controller 12200 may store data DAT into the flash memory 12300 in response to a write command input via the card connection unit 12100. The data DAT may be stored in synchronization with a clock signal generated from a clock generator (not shown) in the card controller 12200. The flash memory 12300 may store data DAT transferred from the host 1100. For example, in a case where the host 11000 is a digital camera, the flash memory 12300 may store digital image data.

At a program operation of an LSB page, the memory card system 10000 in FIG. 18 may store invalidation information of a previously programmed LSB page and/or location information of the previously programmed LSB page at a spare area of an LSB page to be currently programmed. Thus, when a recovery LSB operation is performed after a power off, a recovery operation on invalidated LSB pages of damaged LSB pages can be skipped. Further, it is possible to rapidly search find data corresponding to data of the damaged LSB pages.

Figure 19:
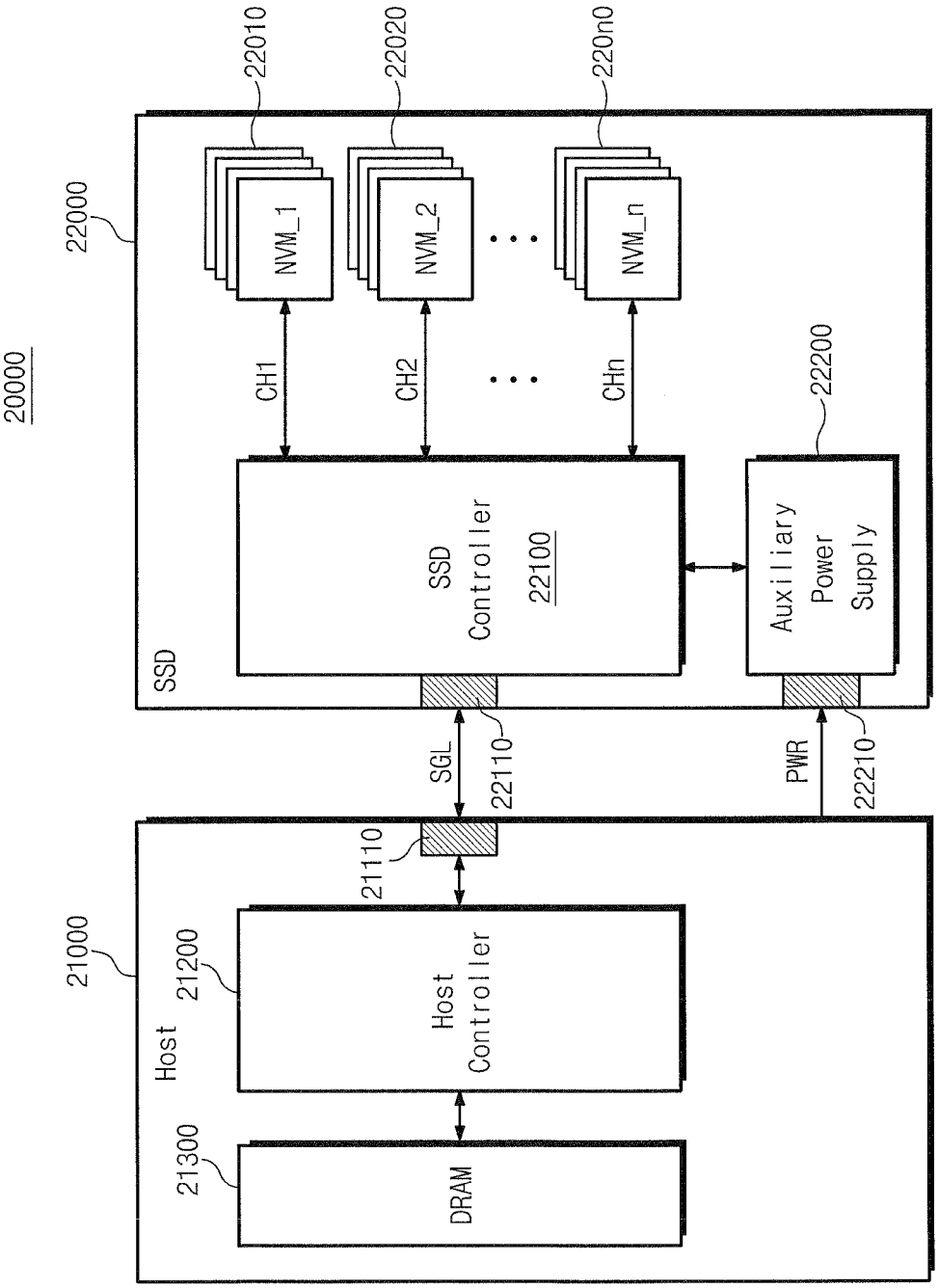
FIG. 19 is a block diagram illustrating a solid state drive system in which a memory system according to the inventive concept is applied.

FIG. 19 is a block diagram illustrating a solid state drive system in which a memory system according to the inventive concept is applied. Referring to FIG. 19, a solid state drive (SSD) system 20000 may include a host 21000 and an SSD 22000. The host 21000 may include a host interface 21110, a host controller 21200, and a DRAM 21300.

The host 21000 can write data into the SSD 22000 and/or read data from the SSD 22000. The host controller 21200 transfers signals SGL such as a command, an address, a control signal, and the like to the SSD 22000 via the host interface 21110. The DRAM 21300 may be a main (system) memory of the host 21000.

The SSD 22000 can exchange signals SGL with the host 21000 via the host interface 22110, and may be supplied with a power via a power connector 22210. The SSD 22000 may include a plurality of nonvolatile memories 22010 through 220*n*0, an SSD controller 22100, and an auxiliary power supply 22200. Herein, the nonvolatile memories 22010 to 220*n*0 may be implemented by not only a NAND flash memory but also or alternatively by other nonvolatile memories such as PRAM, MRAM, ReRAM, and the like.

The plurality of nonvolatile memories 22010 through 220*n*0 may be used as the bulk storage medium of the SSD 22000. The plurality of nonvolatile memories 22010 to 220*n*0 may be connected with the SSD controller 22100 via a plurality of channels CH1 to CHn. One channel may be connected with one or more nonvolatile memories. Nonvolatile memories connected with one channel may be connected with the same data bus.

The SSD controller 22100 may exchange signals SGL with the host 21000 via the host interface 22110. Herein, the signals SGL may include a command, an address, data, and the like. The SSD controller 22100 is configured to write data to or read data out from a corresponding nonvolatile memory according to the current command of the host 21000. The SSD controller 22100 will be more fully described with reference to FIG. 20.

The auxiliary power supply 22200 may be connected with the host 21000 via the power connector 22210. The auxiliary power supply 22200 may be charged by a power PWR from the host 21000. The auxiliary power supply 22200 may be placed inside or outside the SSD 22000. For example, the auxiliary power supply 22200 may be put on a main board to supply the auxiliary power to the SSD 22000.

Figure 20:
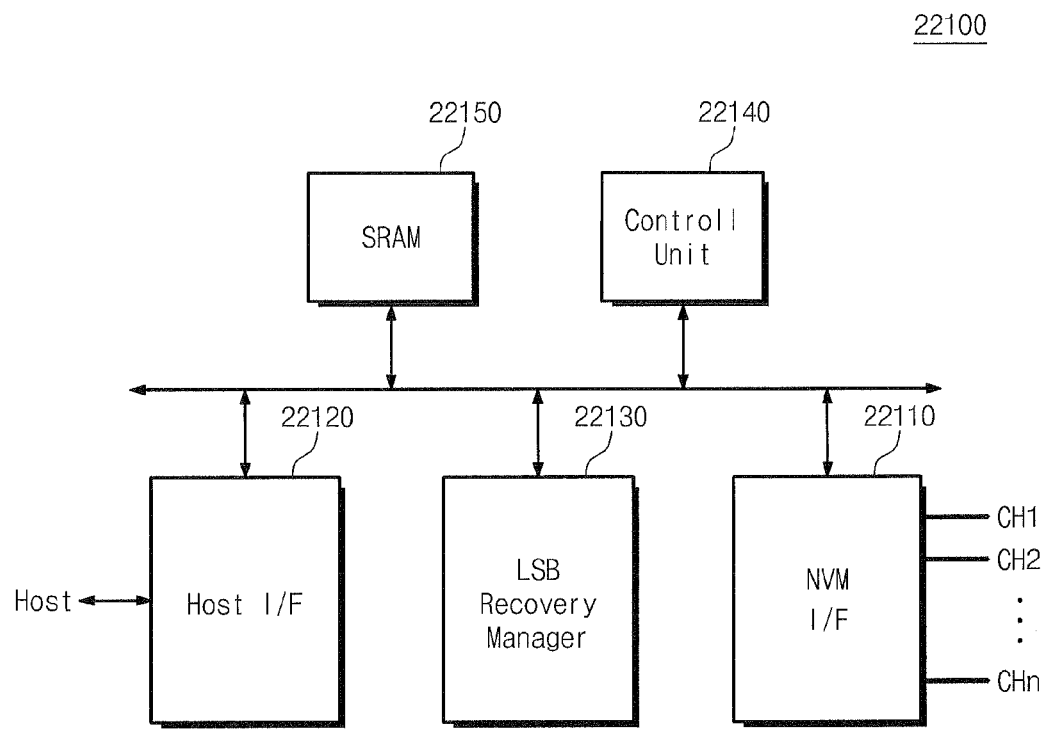
FIG. 20 is a block diagram schematically illustrating the SSD controller in the solid state drive system of FIG. 19.

FIG. 20 is a block diagram schematically illustrating the SSD controller 22100 in the solid state drive system of FIG. 19. Referring to FIG. 20, an SSD controller 22100 includes an NVM interface 22110, a host interface 22120, an LSB recovery manger 22130, a control unit 22140, and an SRAM 22150.

The NVM interface 22110 may distribute data transferred from a main memory of a host 21000 to channels CH1 to CHn, respectively. The NVM interface 22110 may transfer data read from nonvolatile memories 22010 to 220n0 to the host 21000 via the host interface 22120.

The host interface 22120 provides interface with an SSD 22000 according to the protocol of the host 21000. The host interface 2212 may communicate with the host 21000 using USB (Universal Serial Bus), SCSI (Small Computer System Interface), PCI express, ATA, PATA (Parallel ATA), SATA (Serial ATA), SAS (Serial Attached SCSI), etc. The host interface 22120 may perform a disk emulation function which enables the host 21000 to recognize the SSD 22000 as a hard disk drive (HDD).

At each program operation of an LSB page, as described with reference to FIG. 1, the LSB recovery manger 22130 controls the overall operation for storing invalidation information of a previously programmed LSB page and/or location information of the previously programmed LSB page at a spare area of an LSB page to be programmed.

The SRAM 22150 may be used by the control unit 22140 or by the LSB recovery manger 22130 to execute software that efficiently manages the nonvolatile memories 22010 to 220n0. The SRAM 22150 may store metadata input from a main memory of the host 21000 or cache data. At a sudden power-off operation, metadata or cache data stored in the SRAM 22150 may be stored in the nonvolatile memories 22010 to 220n0 using an auxiliary power supply 22200.

Returning to FIG. 19, at a program operation of an LSB page, the SSD system 20000 may store invalidation information of a previously programmed LSB page and/or location information of the previously programmed LSB page at a spare area of an LSB page to be currently programmed. Thus, when a recovery operation is performed, a recovery operation on invalidated LSB pages of damaged LSB pages may be skipped. Further, it is possible to rapidly find backup data corresponding to data of the damaged LSB pages.

Figure 21:
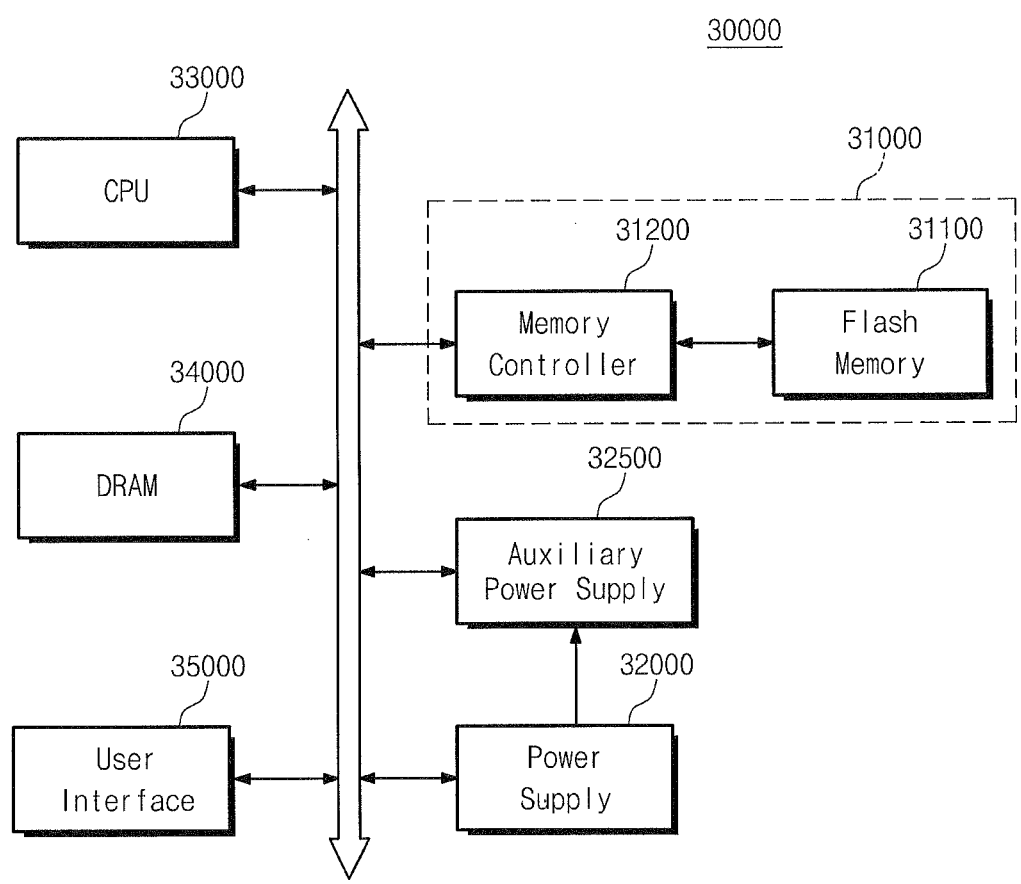
FIG. 21 is a block diagram schematically illustrating an electronic device including a flash memory system according to an embodiment of the inventive concept.

FIG. 21 is a block diagram schematically illustrating an electronic device including a flash memory system according to an embodiment of the inventive concept. Herein, an electronic device 30000 may be a personal computer or a handheld electronic device such as a notebook computer, a cellular phone, a PDA, a camera, and the like.

Referring to FIG. 21, the electronic device 30000 may include a memory system 31000, a power supply device 32000, an auxiliary power supply 32500, a CPU 3300, a DRAM 34000, and a user interface 35000. The memory system 31000 may include a flash memory 31100 and a memory controller 31200. The memory system 31000 can be embedded within the electronic device 30000.

At a program operation of an LSB page, the electronic device 30000 may store invalidation information of the previously programmed LSB page and/or location information of the previously programmed LSB page at a spare area of an LSB page to be currently programmed. Thus, when a recovery operation is performed, a recovery operation on invalidated LSB pages of damaged LSB pages may be skipped. Further, it is possible to rapidly find backup data corresponding to data of the damaged LSB pages.

A memory system according to an exemplary embodiment of the inventive concept can be embodied as a flash memory having a three-dimensional structure as well as a flash memory having a two-dimensional structure.

Figure 22:
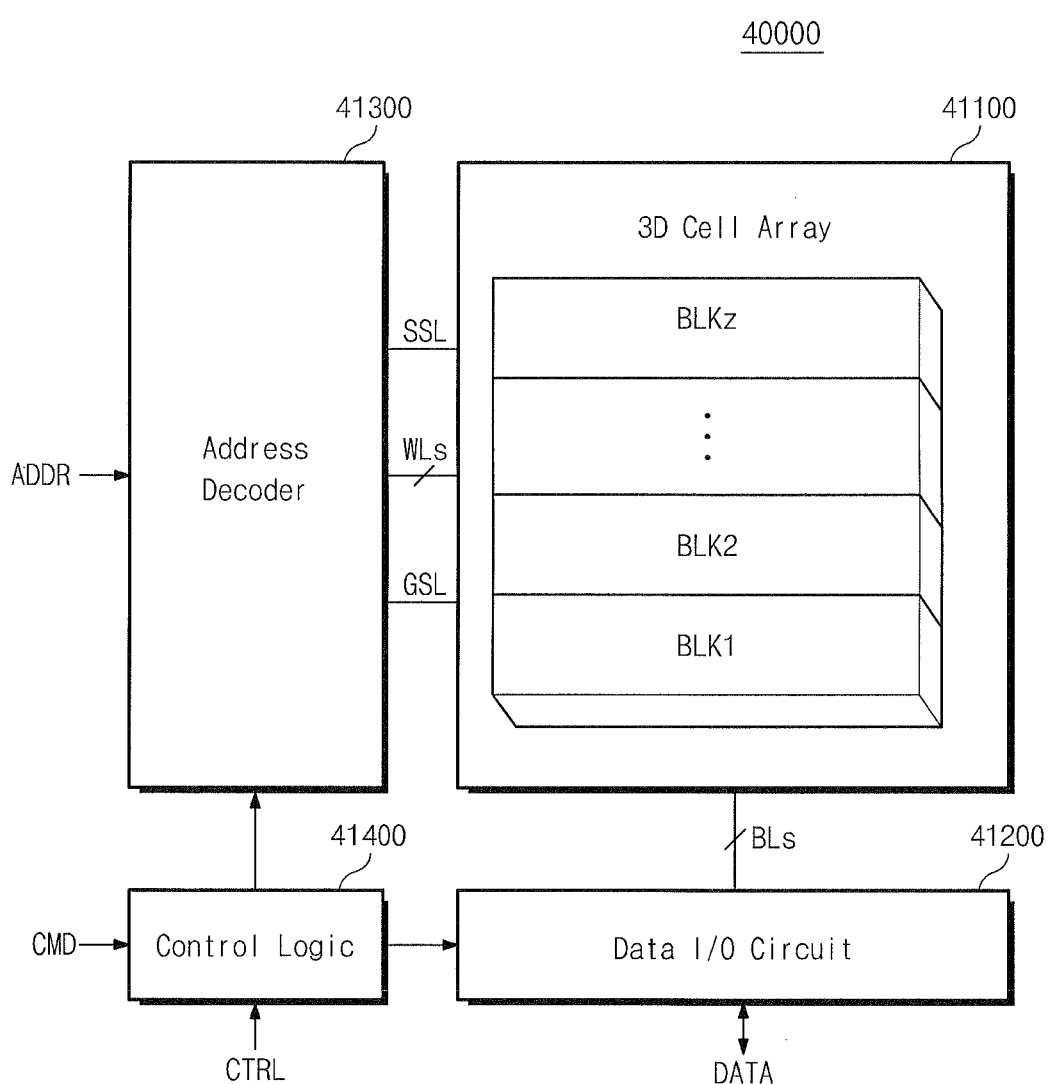
FIG. 22 is a block diagram schematically illustrating a flash memory applying an exemplary embodiment of the inventive concept.

FIG. 22 is a block diagram schematically illustrating a flash memory applying an exemplary embodiment of the inventive concept. Referring to FIG. 22, a flash memory 40000 may include a three-dimensional (3D) cell array 41100, a data input/output circuit 41200, an address decoder 41300, and control logic 41400.

The 3D cell array 41100 may include a plurality of memory blocks BLK1 to BLKz, each of which is formed to have a three-dimensional structure (or, a "vertical" structure). For a memory block having a two-dimensional (horizontal) structure, memory cells may be formed in a direction horizontal to a substrate. For a memory block having a three-dimensional structure, memory cells may be formed in a direction perpendicular to the substrate. Each memory block may be an erase unit of the flash memory 40000.

The data input/output circuit 41200 may be connected with the 3D cell array 41100 via a plurality of bit lines. The data input/output circuit 41200 may receive data from an external device or output data read from the 3D cell array 41100 to the external device. The address decoder 41300 may be connected with the 3D cell array 41100 via a plurality of word lines and selection lines GSL and SSL. The address decoder 41300 selects the word lines in response to an address ADDR.

The control logic 41400 controls programming, erasing, reading, etc. of the flash memory 40000. For example, while programming memory cells, the control logic 41400 may control the address decoder 41300 such that a program voltage is supplied to a currently selected word line, and may control the data input/output circuit 41200 such that data is programmed.

Figure 23:
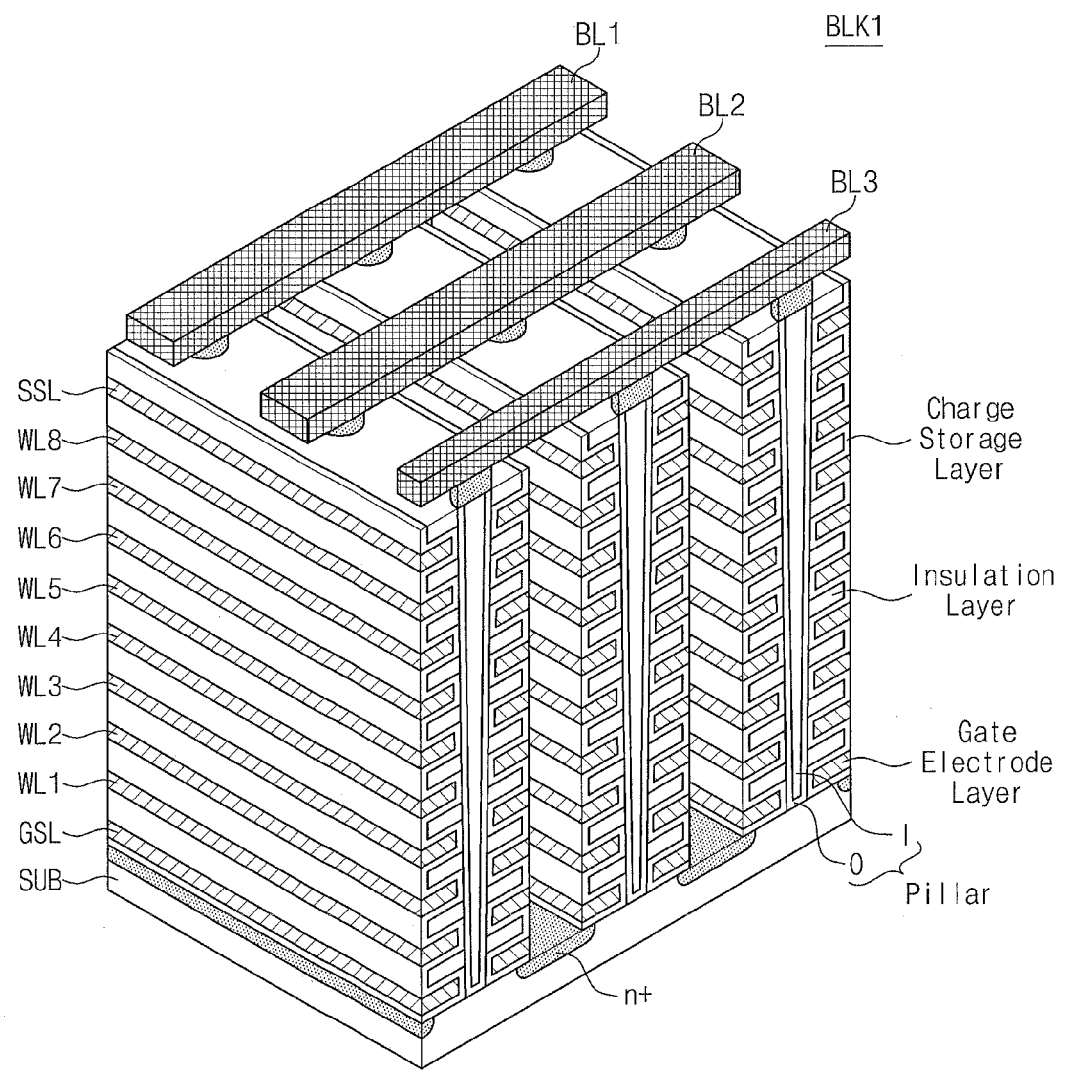
FIG. 23 is a perspective view schematically illustrating the 3D structure of the memory block shown in the flash memory of FIG. 22.

FIG. 23 is a perspective view schematically illustrating the 3D structure of the memory block BKL1 shown in FIG. 22. Referring to FIG. 23, the memory block BLK1 may be formed in a direction perpendicular to a substrate SUB. An n+doping region is formed at the substrate SUB. A plurality of gate electrode layers and conformal insulation layers are alternately deposited on the substrate SUB]. A vertical charge storage layer is formed between the stacked gate electrode layers and the insulation layers.

If the gate electrode layers and the insulation layers are patterned in a vertical direction, a V-shaped cavity may be formed into which a V-shaped channel pillar may be formed. The channel pillar may be connected with the substrate SUB at the n+doping region via the gate electrode layer and the insulation layer. An outer portion O of the channel pillar may be formed of a channel semiconductor, and an inner portion I thereof may be formed of an insulation material such as silicon oxide.

The gate electrode layer of the memory block BLK1 may be connected with a ground selection line GSL, a plurality of word lines WL1 to WL8, and a string selection line SSL. The pillar of the memory block BLK1 may be connected with a plurality of bit lines BL1 to BL3. In FIG. 23, there is illustrated the case that one memory block BLK1 has two selection lines SSL and GSL, eight word lines WL1 to WL8, and three bit lines BL1 to BL3. However, the inventive concept is not limited thereto.

Figure 24:
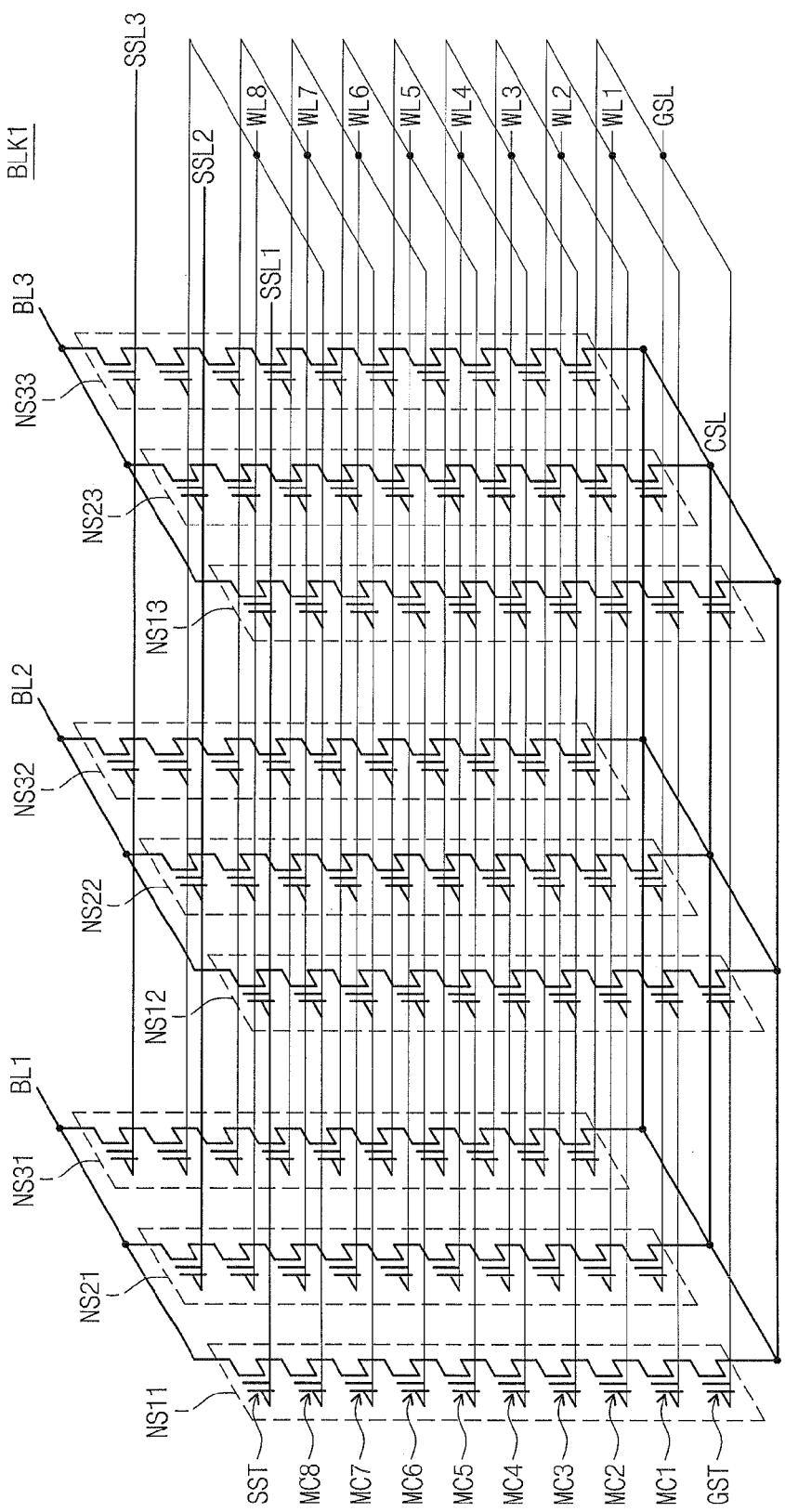
FIG. 24 is a circuit diagram schematically illustrating an equivalent circuit of the 3-D memory block illustrated in FIG. 23.

FIG. 24 is a circuit diagram schematically illustrating an equivalent circuit of the 3-D memory block illustrated in FIG. 23. Referring to FIG. 24, NAND strings NS11 to NS33 may be connected between bit lines BL1 to BL3 and a common source line CSL. Each NAND string (e.g., NS11) includes a string selection transistor SST, a plurality of memory cells MC1 to MC8, and a ground selection transistor GST.

The string selection transistors SST may be connected with string selection lines SSL1 to SSL3. The memory cells MC1 to MC8 may be connected with corresponding word lines WL1 to WL8, respectively. The ground selection transistors GST may be connected with ground selection line GSL. A string selection transistor SST may be connected with a bit line and a ground selection transistor GST may be connected with a common source line CSL.

Word lines (e.g., WL1) having the same height may be connected in common, and the string selection lines SSL1 to SSL3 may be separated from one another. At programming of memory cells (constituting a page) connected with a first word line WL1 and included in NAND strings NS11, NS12, and NS13, there may be selected a first word line WL1 and a first string selection line SSL1.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory device, comprising:
    a nonvolatile memory including a plurality of wordlines; and
    a controller configured to control the nonvolatile memory, wherein the controller controls the nonvolatile memory such that an LSB program operation on a first wordline of the plurality of wordlines is performed and then an LSB program operation on a second wordline of the plurality of wordline is performed; and
    wherein while the LSB program operation on the second wordline is performed, the nonvolatile memory stores information about LSB data programmed at the first wordline in spare memory cells on the second wordline in a spare area of the nonvolatile memory,
    wherein the information indicates the LSB data is invalid when the LSB data programmed at the first word line is invalid, and
    wherein if a power-off occurred during a MSB program operation on the first word line, the controller controls the nonvolatile memory to skip a LSB recovery operation on the LSB data stored at the first wordline when the information indicates the LSB data programmed at the first wordline is invalid.

2. The nonvolatile memory device of claim 1, wherein each wordline comprises an LSB page and an MSB page, and wherein if a logical address of the LSB data programmed at the first wordline is equal to a logical address of data programmed at the second wordline, the nonvolatile memory stores the information indicating that the LSB data programmed at the first wordline is invalid, at the spare area of the second wordline.

3. The nonvolatile memory device of claim 2, wherein after the LSB program operation on the second wordline is performed, the nonvolatile memory performs an MSB program operation on the first word line.

4. The nonvolatile memory device of claim 3, wherein if the nonvolatile memory stores information indicating that the LSB data programmed at the first wordline is invalid, the nonvolatile memory does not perform a backup operation on the LSB data stored at the first wordline.

5. The nonvolatile memory device of claim 1, wherein if a logical address of data programmed at the first page is not equal to a logical address of data programmed at the second page, the nonvolatile memory stores address information, indicating a backup location of the LSB data programmed at the first page, at memory cells in a spare area of the second wordline.

6. The nonvolatile memory device of claim 5, wherein after the LSB program operation on the second wordline is performed the nonvolatile memory backs up the LSB data programmed at the first wordline to a location indicated by the address information before an MSB program operation on the first wordline is performed by the controller.

7. The nonvolatile memory device of claim 5, wherein the controller comprises:
    a mapping table that manages logical addresses and physical addresses associated with a page to be programmed of the plurality of wordlines; and
    an LSB recovery manager which judges whether a logical address of write-requested data is equal to a logical address of a programmed page, based on the mapping table.

8. The nonvolatile memory device of claim 7, wherein the mapping table further includes information indicating whether data stored at the programmed page is LSB data, and wherein: when a logical address of the write-requested data is equal to a logical address of a selected one of programmed pages, the LSB recovery manager judges whether the selected page is an LSB page, based on the mapping table.

9. The nonvolatile memory device of claim 8, wherein the LSB recovery manager judges whether a page at which the write-requested data is to be stored is an LSB page, based on the mapping table.

10. The nonvolatile memory device of claim 1, wherein the controller controls the nonvolatile memory to perform a program operation by a unit formed of a plurality of pages.

11. A program method of a nonvolatile memory supporting multilevel cell storage, the program method comprising:
    a controller of the nonvolatile memory receiving and writing first write-requested data to the nonvolatile memory and then receiving second write-requested data;
    the controller judging whether a LSB page of the first write-requested data is invalidated, based on the second write-requested data;
    the controller storing information, indicating that the LSB page of the first write-requested data is invalid, at a spare area of a page in the nonvolatile memory at which the second write-requested data is to be programmed; and
    if a power-off occurred, the controller skipping a LSB recovery operation on the LSB page of the first write-requested data when the information indicates the LSB page of the first write-requested data is invalid.

12. The program method of claim 11, further comprising: storing location information, at which the LSB page of the first write-requested data is to be backed up, at a spare area of the page where the second write-requested data is to be programmed, when a logical address of the second write-requested data is not equal to a logical address of the LSB page of the first write-requested data.

13. The program method of claim 11, further comprising: comparing a logical address of the second write-requested data with a logical address managed at a mapping table.

14. A nonvolatile memory device, comprising: a memory block including:
  a first wordline connected to a first plurality of nonvolatile memory cells;
  a second wordline connected to a second plurality of nonvolatile memory cells;
  a third wordline connected to a third plurality of nonvolatile memory cells;
  a fourth wordline connected to a fourth plurality of nonvolatile memory cells;
  a first bitline in a data storage region of the memory block and connected to one nonvolatile memory cell in each of first, second, third, and fourth pluralities of nonvolatile memory cells;
  a second bitline in a spare region of the memory block and connected to one nonvolatile memory cell in each of first, second, third, and fourth pluralities of nonvolatile memory cells; and
  a controller configured to control the nonvolatile memory, wherein the controller controls the nonvolatile memory such that:
    a first LSB program operation is performed on the memory cells connected to the first wordline in the data storage region; and
    then an second LSB program operation is performed on the memory cells connected to the second wordline in the data storage region;

wherein while the second LSB program operation is being performed, the nonvolatile memory stores information about LSB data programmed at the first wordline in the spare region of the memory block,
  wherein the information indicates the LSB data is invalid when the LSB data stored at the first word line is invalid, and
  wherein if a power-off occurred, the controller controls the nonvolatile memory to skip a LSB recovery operation on the LSB data stored at the first wordline when the information indicates the LSB data programmed at the first wordline is invalid.

15. The nonvolatile memory device of claim 14, wherein the controller further controls the nonvolatile memory such that:
  after the second LSB program operation is performed, then a first MSB program operation is performed on the memory cells connected to the first wordline in the data storage region; and
  then a third LSB program operation is performed on the memory cells connected to the third wordline in the data storage region; and
  then a second MSB program operation is performed on the memory cells connected to the second wordline in the data storage region.

16. The nonvolatile memory device of claim 15, wherein before the second MSB program operation is performed, the nonvolatile memory backs up LSB data programmed during the first LSB program operation to a backup location indicated by address information, wherein the address information is stored in memory cells in a spare area of the second wordline while the second LSB program operation is being performed.

* * * * *